(12) United States Patent
Goodwin et al.

(10) Patent No.: US 6,368,884 B1
(45) Date of Patent: *Apr. 9, 2002

(54) DIE-BASED IN-FAB PROCESS MONITORING AND ANALYSIS SYSTEM FOR SEMICONDUCTOR PROCESSING

(75) Inventors: Greg Goodwin; Anastasia Lynn Oshelski, both of Austin, TX (US)

(73) Assignee: Advanced Micro Devices, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/548,142

(22) Filed: Apr. 13, 2000

(51) Int. Cl.[7] ................................................ G01R 31/26
(52) U.S. Cl. ............................. 438/14; 432/15; 432/16; 432/17; 324/765; 382/147; 382/149; 382/151
(58) Field of Search .................... 438/14–16; 250/234; 264/406

(56) References Cited

U.S. PATENT DOCUMENTS

| | | | | |
|---|---|---|---|---|
| 5,420,796 A | * | 5/1995 | Weling et al. | 364/468 |
| 5,917,332 A | * | 6/1999 | Chen et al. | 324/765 |
| 5,971,586 A | * | 10/1999 | Mori | 364/468.15 |
| 5,972,727 A | * | 10/1999 | Ryan et al. | 438/14 |
| 6,016,562 A | * | 1/2000 | Miyazaki et al. | 714/724 |

* cited by examiner

Primary Examiner—John F. Niebling
Assistant Examiner—Olivia Luk
(74) Attorney, Agent, or Firm—Williams, Morgan & Amerson

(57) ABSTRACT

A method is provided for manufacturing, the method including processing a workpiece in a plurality of processing steps and measuring characteristics of the processing performed on the workpiece in at least two of the plurality of processing steps. The method also includes displaying the characteristics measured by overlaying the characteristics measured at each of the at least two of the plurality of processing steps to display a final resulting workpiece.

36 Claims, 20 Drawing Sheets

DIE-BASED IN-FAB PROCESS MONITORING AND ANALYSIS SYSTEM FOR SEMICONDUCTOR PROCESSING

BACKGROUND OF THE INVENTION

1. Field of the Invention

This invention relates generally to semiconductor fabrication technology, and, more particularly, to a method for semiconductor fabrication supervision and optimization.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, ie., local site and worldwide, monitoring. These deficiencies can engender nonoptimal control of critical processing parameters, such as throughput accuracy, stability and repeatability, processing temperatures, mechanical tool parameters, and the like. This variability manifests itself as within-ran disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Among the parameters it would be useful to monitor and control are critical dimensions (CDs) and doping levels for transistors (and other semiconductor devices), as well as overlay errors in photolithography. CDs are the smallest feature sizes that particular processing devices may be capable of producing. For example, the minimum widths w of polycrystalline (polysilicon or poly) gate lines for metal oxide semiconductor field effect transistors (MOSFETs or MOS transistors) may correspond to one CD for a semiconductor device having such transistors. Similarly, the junction depth $d_j$ (depth below the surface of a doped substrate to the bottom of a heavily doped source/drain region formed within the doped substrate) may be another CD for a semiconductor device such as an MOS transistor. Doping levels may depend on dosages of ions implanted into the semiconductor devices, the dosages typically being given in numbers of ions per square centimeter at ion implant energies typically given in keV.

However, traditional statistical process control (SPC) techniques are often inadequate to control precisely CDs and doping levels in semiconductor and microelectronic device manufacturing so as to optimize device performance and yield. Typically, SPC techniques set a target value, and a spread about the target value, for the CDs, doping levels, and/or overlay errors in photolithography. The SPC techniques then attempt to minimize the deviation from the target value without automatically adjusting and adapting the respective target values to optimize the semiconductor device performance, as measured by wafer electrical test (WET) measurement characteristics, for example, and/or to optimize the semiconductor device yield and throughput. Furthermore, blindly minimizing non-adaptive processing spreads about target values may not increase processing yield and throughput.

Traditional control techniques are frequently ineffective in reducing off-target processing and in improving sort yields. For example, the wafer electrical test (WET) measurements are typically not performed on processed wafers until quite a long time after the wafers have been processed, sometimes not until weeks later. When one or more of the processing steps are producing resulting wafers that WET measurements indicate are unacceptable, causing the resulting wafers to be scrapped, this misprocessing goes undetected and uncorrected for quite a while, often for weeks, leading to many scrapped wafers, much wasted material and decreased overall throughput. Similarly, process and/or tool problems throughout the wafer processing are typically not analyzed fast enough, and final wafer yields are not evaluated on a die-by-die basis. Furthermore, data sets for making correlations between processing and/or tool trace data, on the one hand, and testing data, such as WET measurements, on the other, are typically manually extracted by the process engineers and put together, a very time-consuming procedure.

The present invention is directed to overcoming, or at least reducing the effects of, one or more of the problems set forth above.

SUMMARY OF THE INVENTION

In one aspect of the present invention, a method is provided for manufacturing, the method including processing a workpiece in a plurality of processing steps and measuring characteristics of the processing performed on the workpiece in at least two of the plurality of processing steps. The method also includes displaying the characteristics measured by overlaying the characteristics measured at each of the at least two of the plurality of processing steps to display a final resulting workpiece.

In another aspect of the present invention, a computer-readable, program storage device is provided, encoded with instructions that, when executed by a computer, perform a method for processing a workpiece, the method including processing the workpiece in a plurality of processing steps and measuring characteristics of the processing performed on the workpiece in at least two of the plurality of processing steps. The method also includes displaying the characteristics measured by overlaying the characteristics measured at each of the at least two of the plurality of processing steps to display a final resulting workpiece.

In yet another aspect of the present invention, a computer programmed to perform a method of manufacturing is provided, the method including processing a workpiece in a plurality of processing steps and measuring characteristics of the processing performed on the workpiece in at least two of the plurality of processing steps. The method also includes displaying the characteristics measured by overlaying the characteristics measured at each of the at least two of the plurality of processing steps to display a final resulting workpiece.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 1–4 and 12–17 schematically illustrate a flow chart for various embodiments of a method for manufacturing according to the present invention;

FIGS. 5–11 schematically illustrate displays of processing errors and/or issues according to the present invention;

FIG. 18 schematically illustrates a method for fabricating a semiconductor device practiced in accordance with the present invention;

FIG. 19 schematically illustrates workpieces being processed using a photolithography processing tool, using a plurality of control input signals, in accordance with the present invention;

FIGS. 20–21 schematically illustrate one particular embodiment of the process and tool in FIG. 19; and FIG. 22 schematically illustrates one particular embodiment of the method of FIG. 18 as may be practiced with the process and tool of FIGS. 20–21.

Figure 1:
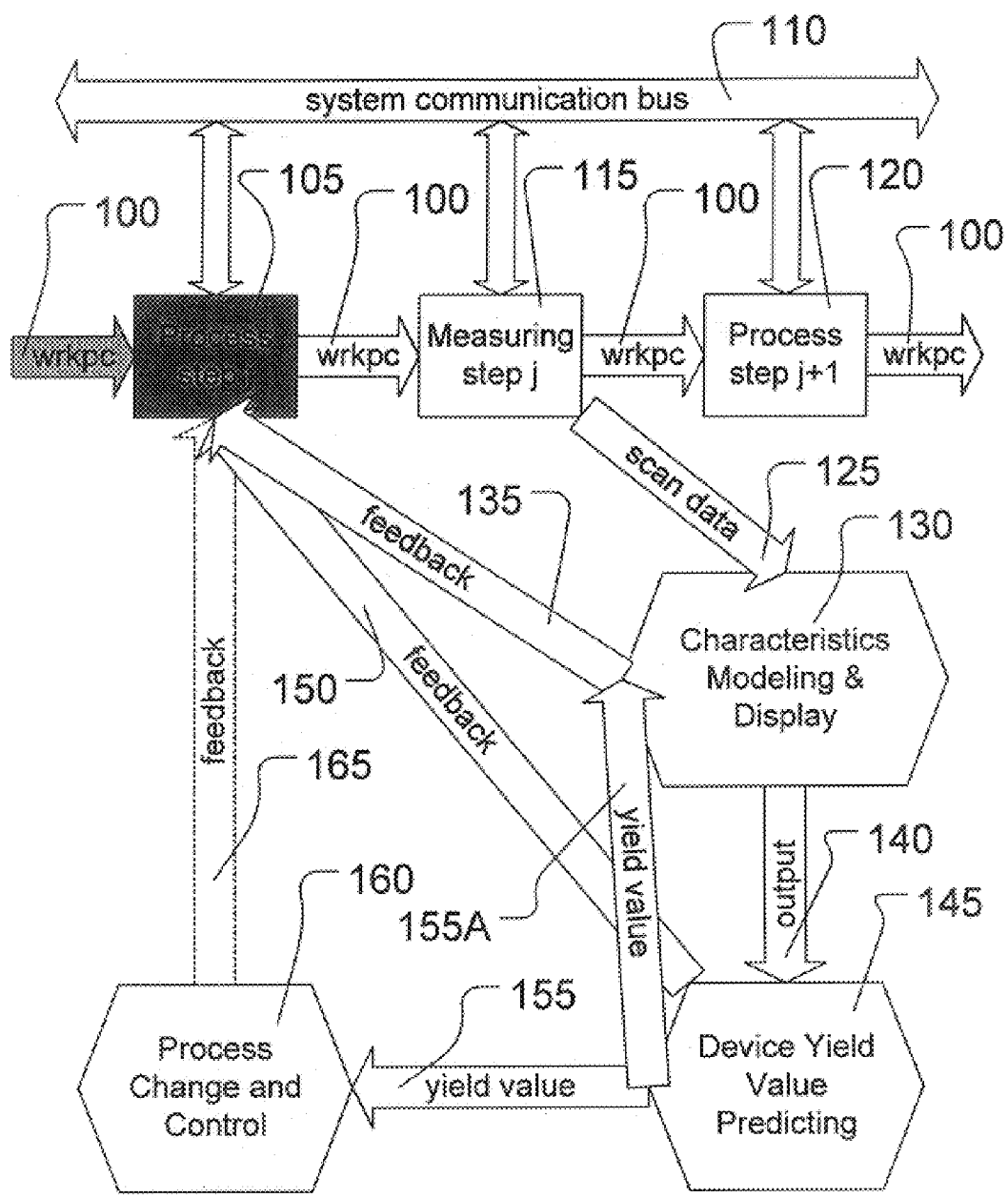
FIGS. 1–22 schematically illustrate various embodiments of a method for manufacturing according to the present invention; and, more particularly.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for manufacturing according to the present invention are shown in FIGS. 1–9. As shown in FIG. 1, a workpiece 100, such as a semiconducting substrate or wafer, having one or more process layers and/or semiconductor devices such as an MOS transistor disposed thereon, for example, is delivered to a processing step j 105, where j may have any value from j=1 to j=N. The total number N of processing steps, such as masking, etching, depositing material and the like, used to form the finished workpiece 100, may range from N=1 to about any finite value.

Figure 2:
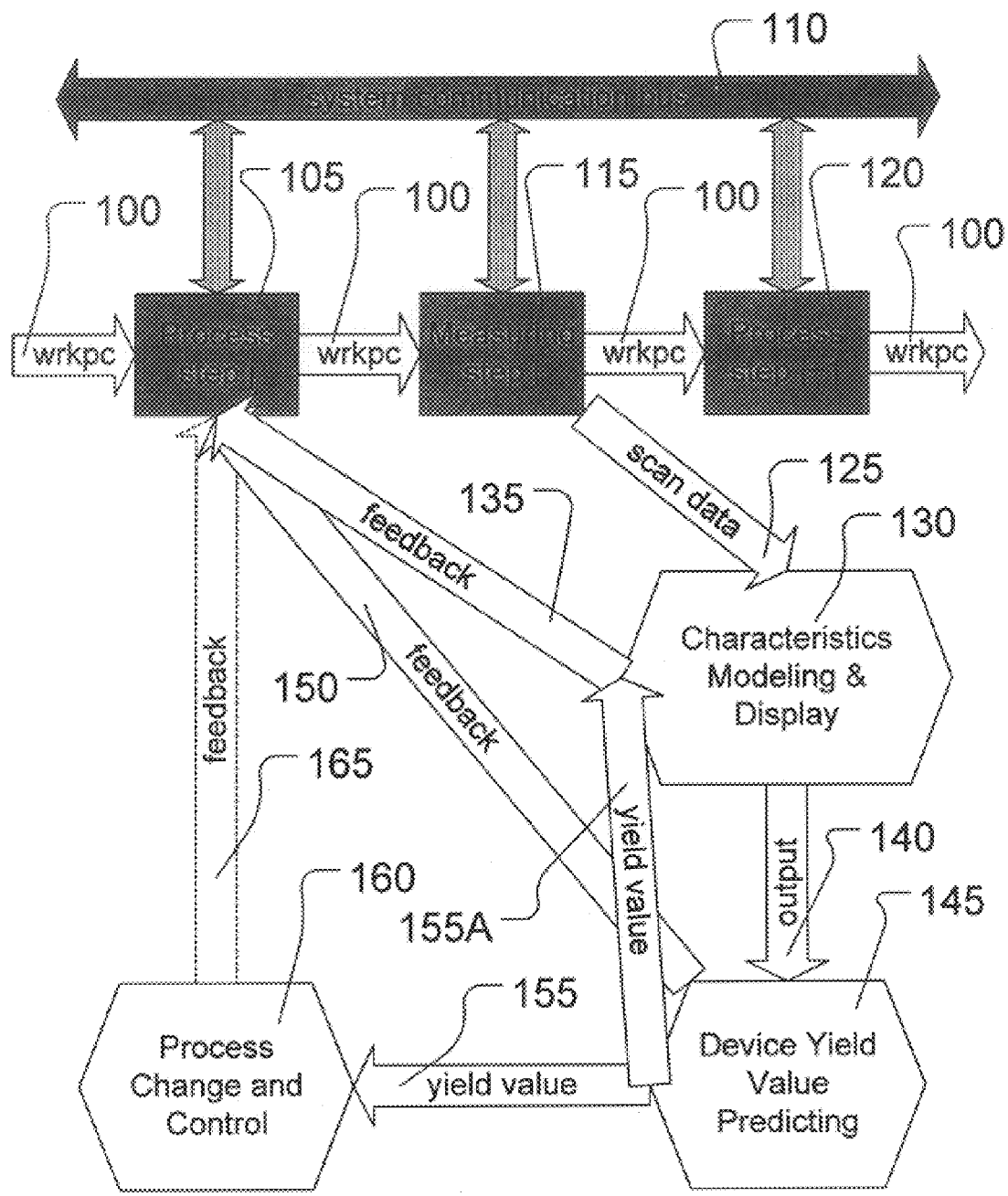

As shown in FIG. 2, a system communication bus 110 may be provided to facilitate communication between the processing step j 105, a measuring step j 115, and a further processing step j+1 120 for further processing, where j may have any value from j=1 to j=N, for a sequence of N total processing steps (when j=N, there will, of course, not be any further processing step N+1 120). Using the system communication bus 110, data and/or instructions may be exchanged between any and/or all of the various N processing and/or N measuring steps. In particular, using the system communication bus 110, scan data 125 from any measuring step j 115, where j may have any value from j=1 to j=N, may be exchanged between, and made available to, any and/or all of the various N processing and/or N measuring steps, which may, in turn, pass the scan data 125 on to any display step such as a characteristic modeling and display step 130.

Figure 3:
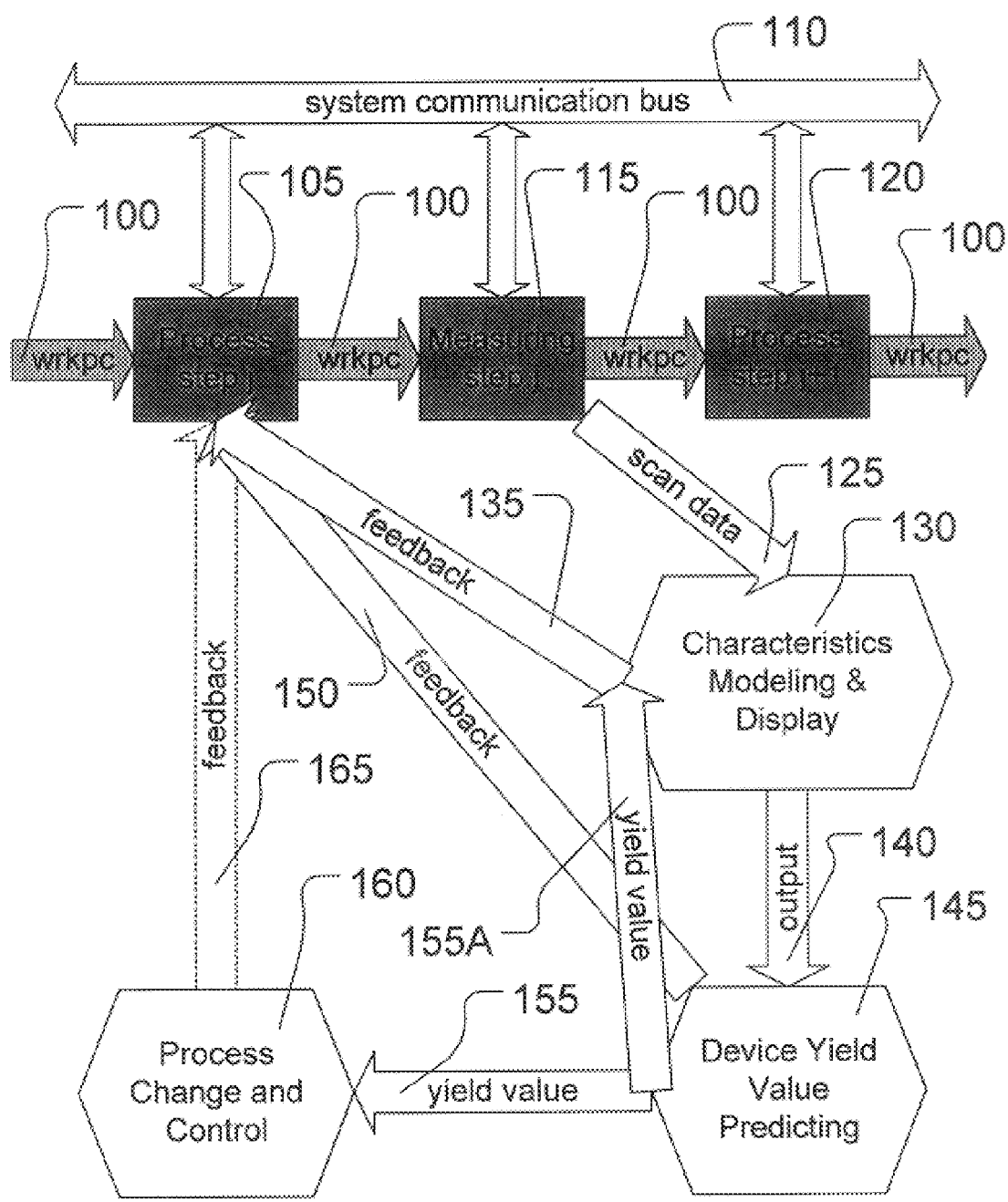

As shown in FIG. 3, the workpiece 100 is sent from the processing step j 105 and delivered to the measuring step j 115. In the measuring step j 115, the workpiece 100 is measured by having a metrology or measuring tool (not shown) and/or a sensing tool (not shown) measure one or more characteristics of the processing performed in any of the previous processing steps (such as processing step j 105, where j may have any value from j=1 to j=N). The measurements in the measuring step j 115 produce the scan data 125 indicative of the one or more characteristics measured in the measuring step j 115. As shown in FIG. 3, if there is further processing to do on the workpiece 100 (if j<N), then the workpiece 100 may be sent from the measuring step j 115 and delivered to the further processing step j+1 120 for further processing, and then sent on from the further processing step j+1 120.

In various illustrative embodiments, the measuring step j 115 may involve measurements and/or detection or sensing of photolithography hotspots (local out-of-focus conditions that affect one or more exposures on a workpiece such as a wafer), photolithography overlay errors, etch uniformity issues, deposition uniformity issues, polishing uniformity issues, bridging issues, stage-leveling errors, laser pulse control issues, and the like. In various other alternative embodiments, the measuring step j 115 may involve other measurements such as surface absorption, surface reflectivity, and photoresist thickness, for example. A parameter and/or parameters measured in the measuring step j 115, such as a critical dimension (CD) of a feature formed on the workpiece 105, may be characteristic of the processing performed on the workpiece 105 in the processing step j 105.

Figure 4:
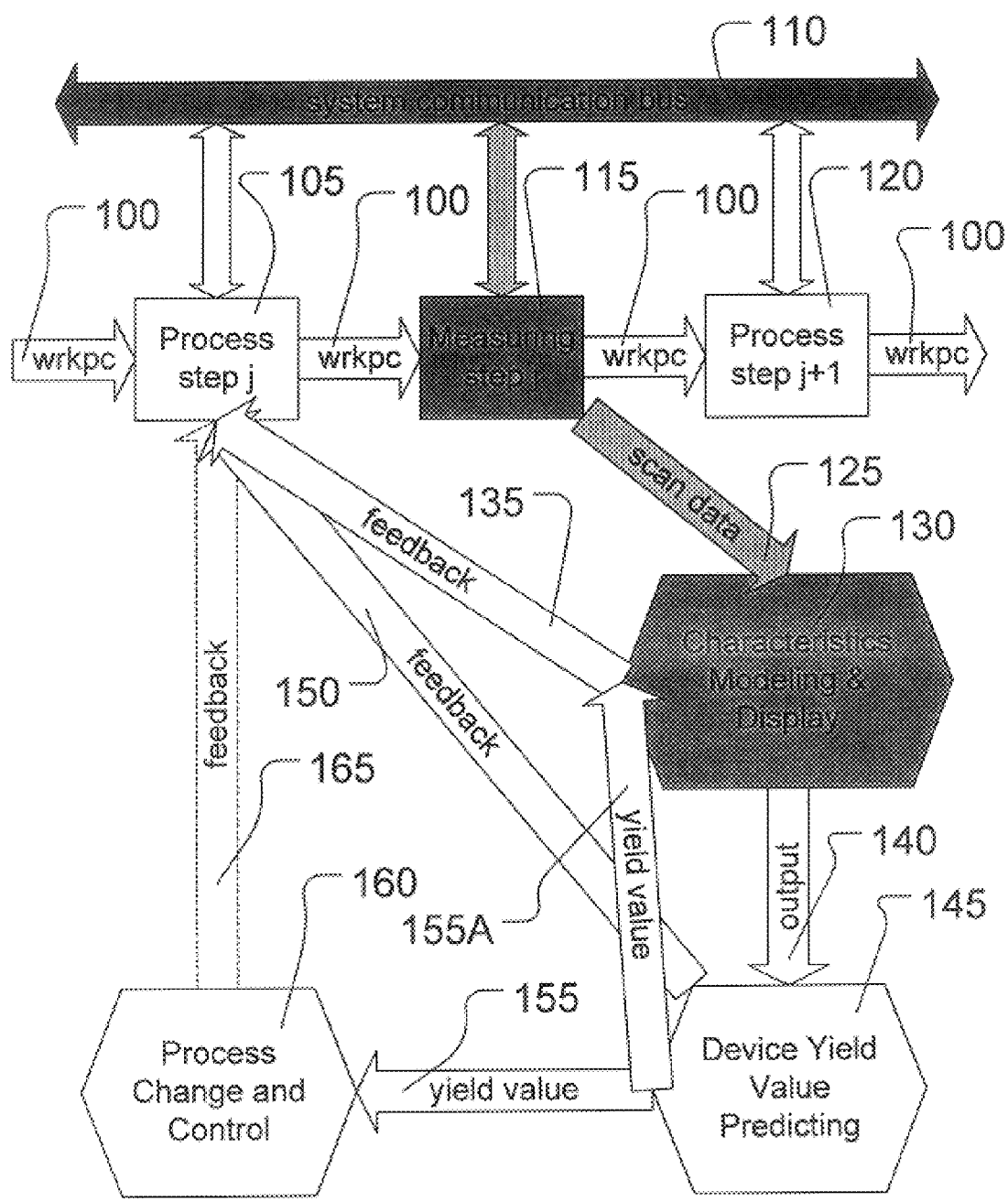

As shown in FIG. 4, the scan data 125 is sent from the measuring step j 115 and delivered to the characteristic modeling and display step 130. Delivering the scan data 125 to the characteristic modeling and display step 130 produces an output signal 140. As shown in FIG. 4, various illustrative embodiments may use the system communication bus 110 to exchange previous scan data 125 from any other measuring step j 115, where j may have any value from j=1 to j=N, with the current measuring step j 115, which may, in turn, pass the previous scan data 125 on to any display step such as the characteristic modeling and display step 130. In the characteristic modeling and display step 130, the one or more characteristics measured in any of the measuring steps j 115, from j=1 to j=N, may be displayed, as schematically illustrated in FIGS. 5–11.

Figure 5:
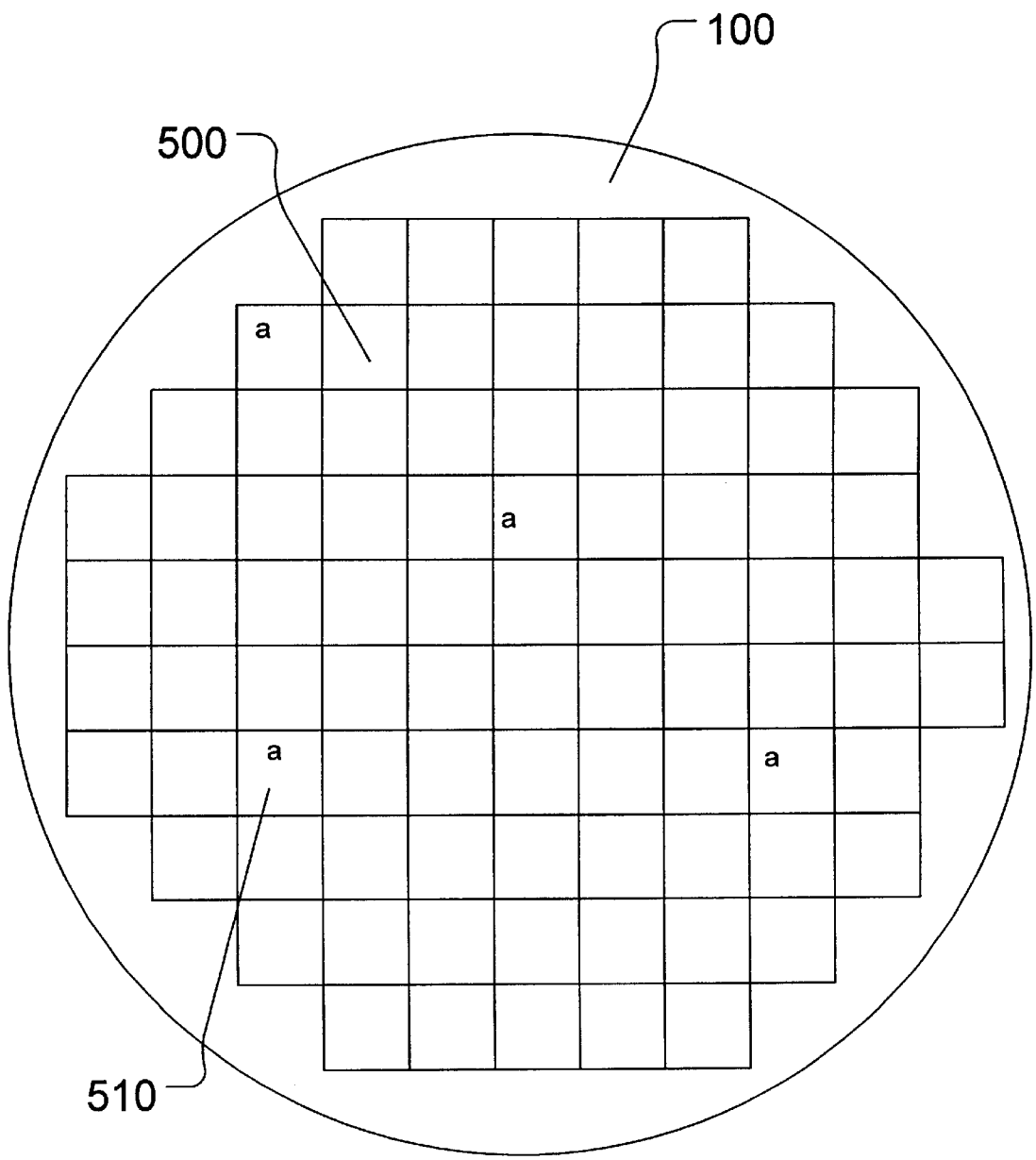

As shown in FIG. 5, the workpiece 100 may have n dies 500 formed thereon, where n may be any number greater than or equal to 1, depending on the size of each die 500 and the overall size of the workpiece 100 (n=84 in FIG. 5). FIG. 5 schematically illustrates the display of the workpiece 100 as may be provided by a user-friendly graphic user interface (GUI), for example. FIG. 5 schematically illustrates the display of the workpiece 100 following a photolithographic processing step j 105, for example, with the "a's" overlaid on the display showing the location of dies 510 whose characteristics, measured in any of the preceding measurement steps j 115, indicate the presence of photolithography hotspots.

Figure 6:
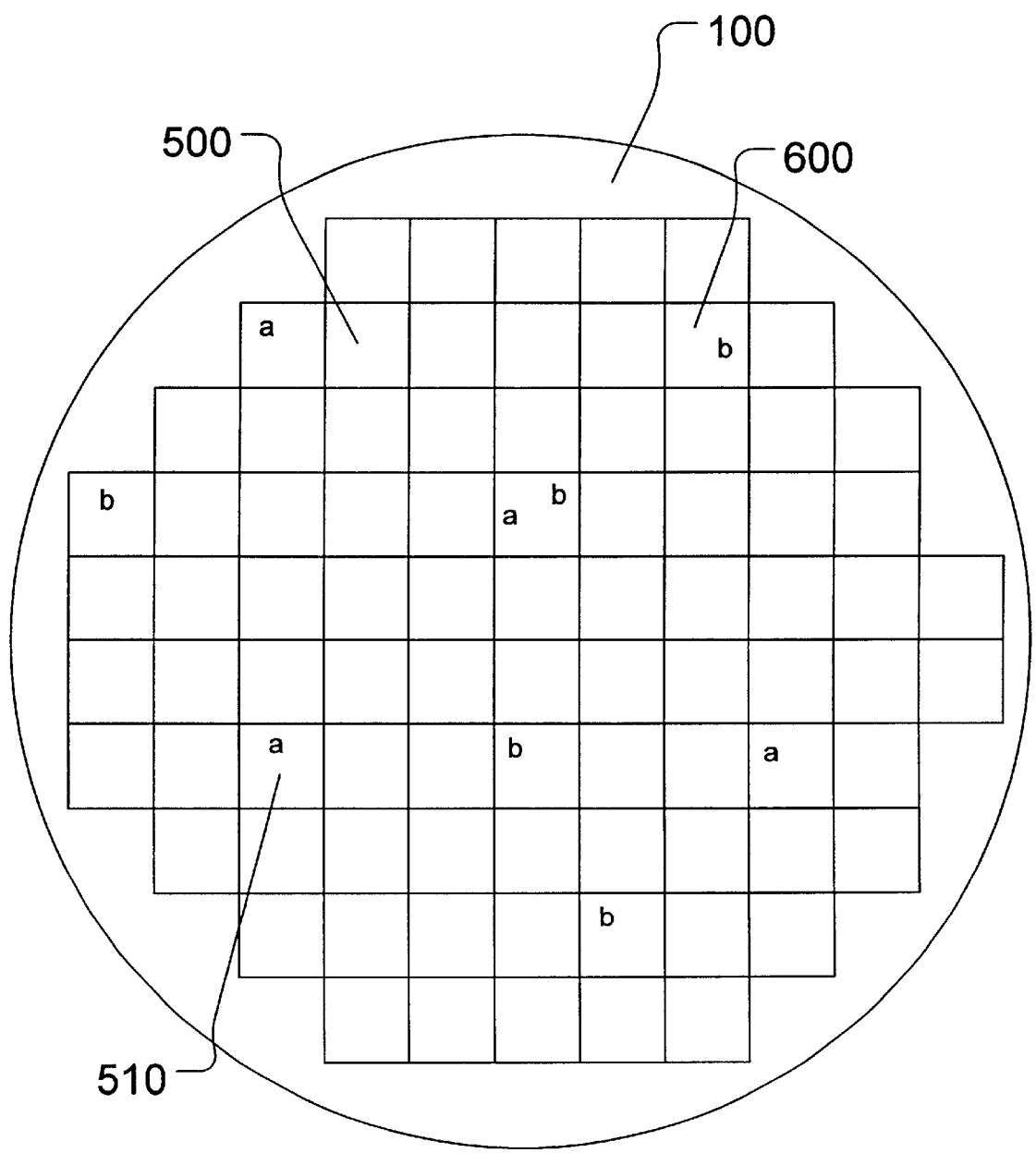

Similarly, FIG. 6 schematically illustrates the display of the workpiece 100 following a photolithographic processing step j 105, for example, with the "b's" overlaid on the display showing the location of dies 600 whose characteristics, measured in any of the preceding measurement steps j 115, indicate the presence of photolithography overlay errors. Exemplary embodiments relating to the handling of photolithography overlay errors are described more fully below, in reference to FIGS. 18–22. As shown in FIG. 6, the photolithography hotspot "a's" may be displayed simultaneously with the photolithography overlay error "b's." Alternatively, a process engineer, using the GUI may choose to display the "a-type" and "b-type" indicators separately, and/or switch back and forth and/or toggle from either type of display.

Figure 7:
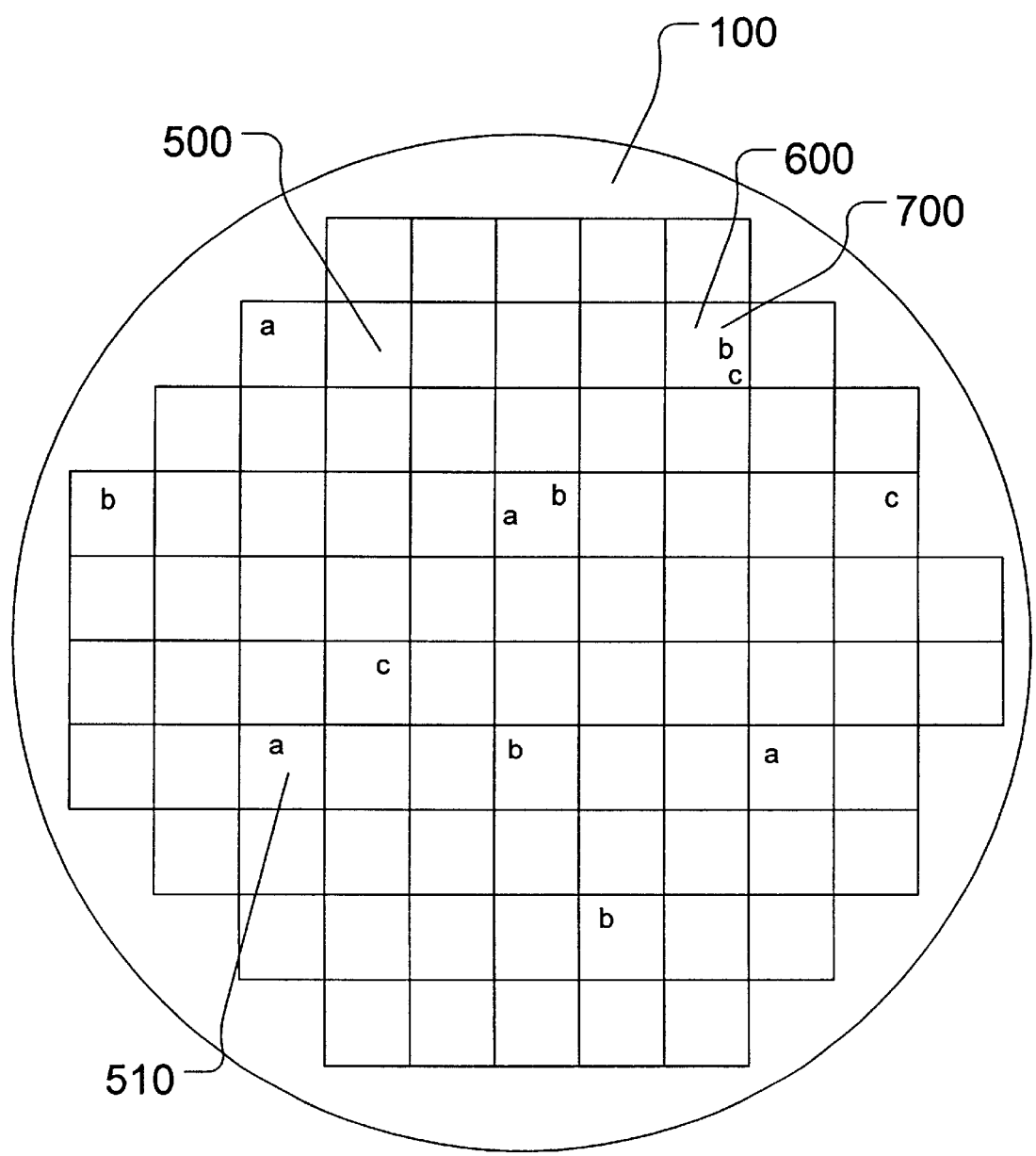

Likewise, FIG. 7 schematically illustrates the display of the workpiece 100 following an etch processing step j 105, for example, with the "c's" overlaid on the display showing the location of dies 700 whose characteristics, measured in any of the preceding measurement steps j 115, indicate the presence of etch uniformity issues. Note that one of the dies 700 is identical with one of the dies 600. As shown in FIG. 7, the etch uniformity issue "c's" may be displayed simultaneously with the photolithography hotspot "a's" and/or the photolithography overlay error "b's." Alternatively, a process engineer, using the GUI may choose to display the "a-type," "b-type" and "c-type" indicators separately, and/or switch back and forth and/or toggle from any and/or all of the various possible combinations of types of display.

Figure 8:
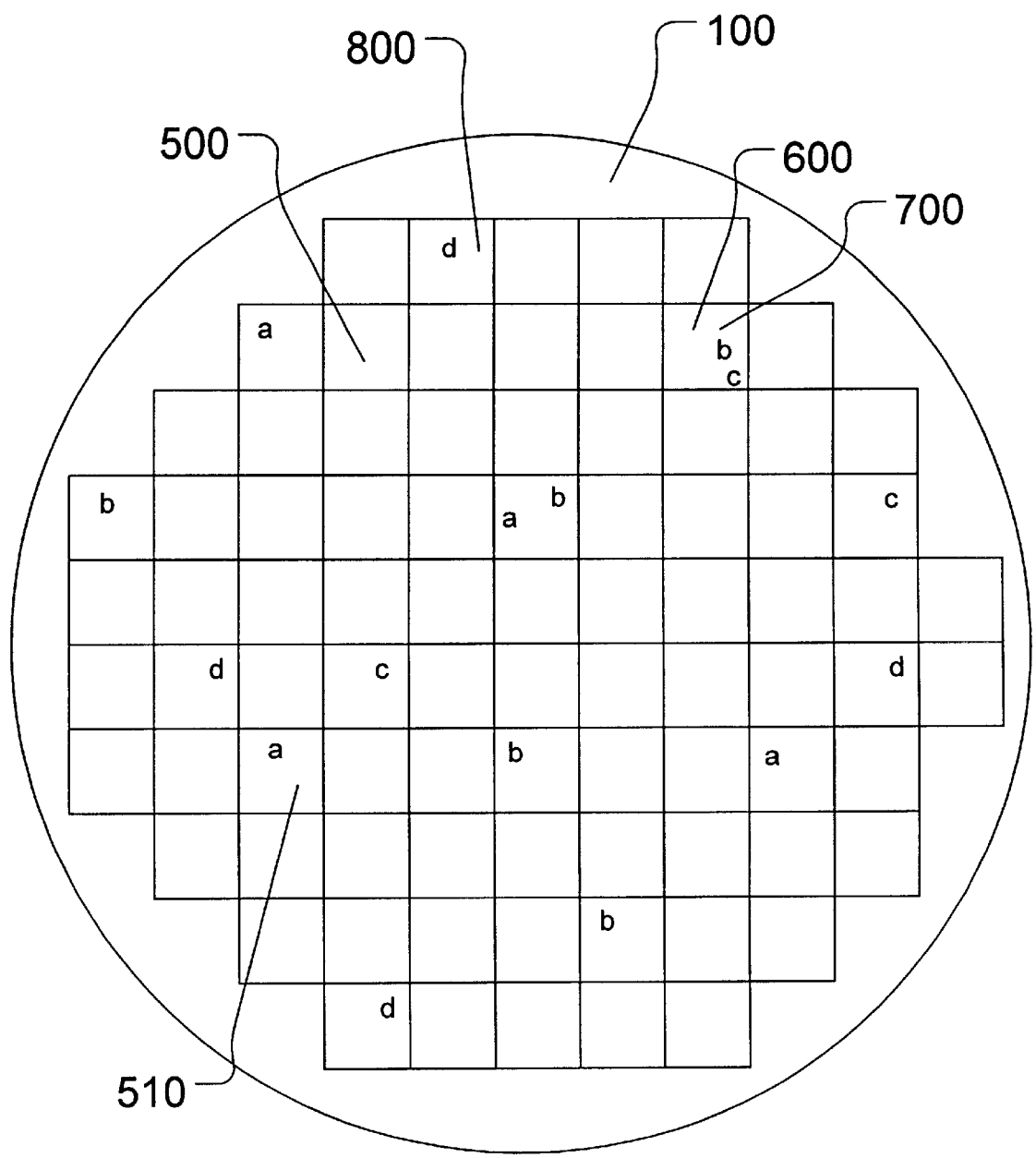

FIG. 8 schematically illustrates the display of the workpiece 100 following a deposition processing step j 105, for example, with the "d's" overlaid on the display showing the location of dies 800 whose characteristics, measured in any of the preceding measurement steps j 115, indicate the presence of deposition uniformity issues. As shown in FIG. 8, the deposition uniformity issue "d's" may be displayed simultaneously with the photolithography hotspot "a's" and/or the photolithography overlay error "b's" and/or the etch uniformity issue "c's." Alternatively, a process engineer, using the GUI may choose to display the "a-type," "b-type," "c-type" and "d-type" indicators separately, and/or switch back and forth and/or toggle from any and/or all of the various possible combinations of types of display.

Figure 9:
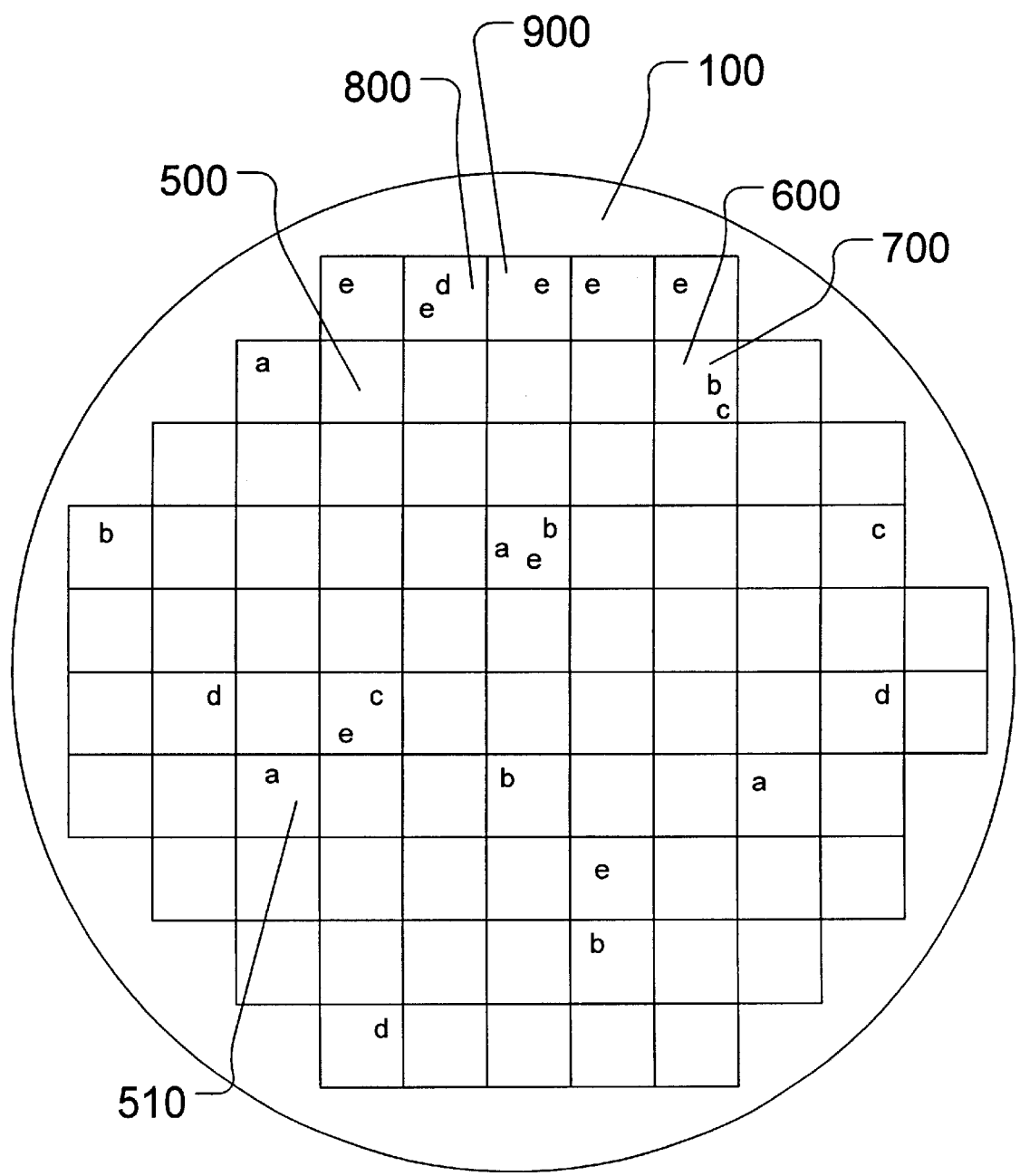

FIG. 9 schematically illustrates the display of the workpiece 100 following a polishing processing step j 105, for example, with the "e's" overlaid on the display showing the location of dies 900 whose characteristics, measured in any of the preceding measurement steps j 115, indicate the presence of polishing uniformity issues. As shown in FIG. 9, the polishing uniformity issue "e's" may be displayed simultaneously with the photolithography hotspot "a's" and/or the photolithography overlay error "b's" and/or the etch uniformity issue "c's" and/or the deposition uniformity issue "d's." Alternatively, a process engineer, using the GUI may choose to display the "a-type," "b-type," "c-type," "d-type" and "e-type" indicators separately, and/or switch back and forth and/or toggle from any and/or all of the various possible combinations of types of display. Note that all the dies in the top row exhibit polishing uniformity issue "e's," which may indicate a misalignment of the polishing tool, for example.

Figure 10:
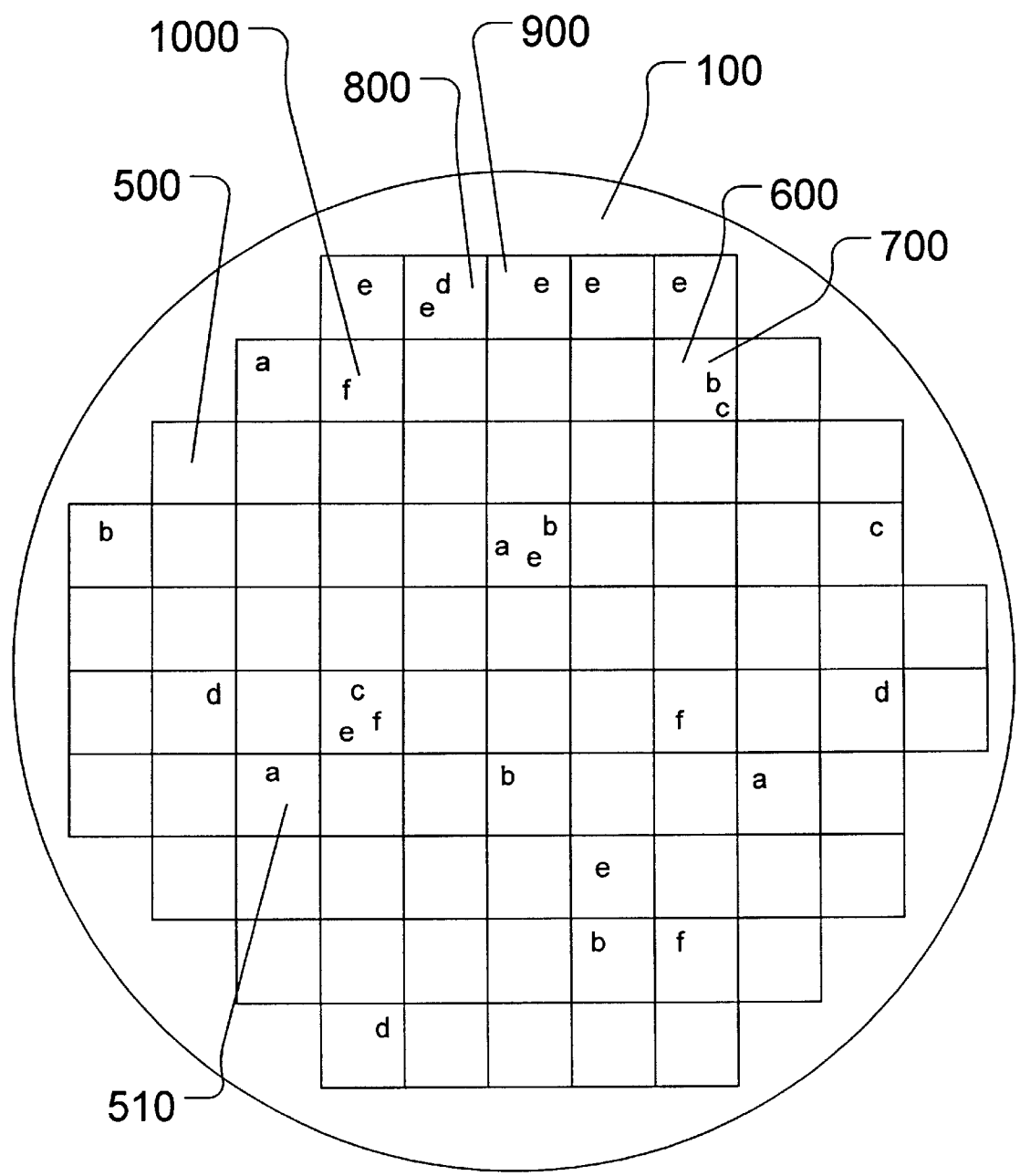

FIG. 10 schematically illustrates the display of the workpiece 100 following a self-aligned silicidation ("salicidation") processing step j 105, for example, with the "f's" overlaid on the display showing the location of dies 1000 whose characteristics, measured in any of the preceding measurement steps j 115, indicate the presence of salicidation bridging issues. As shown in FIG. 10, the salicidation bridging issue "f's" may be displayed simultaneously with the photolithography hotspot "a's" and/or the photolithography overlay error "b's" and/or the etch uniformity issue "c's" and/or the deposition uniformity issue "d's" and/or the polishing uniformity issue "e's." Alternatively, a process engineer, using the GUI may choose to display the "a-type," "b-type," "c-type," "d-type" and "e-type," "f-type" indicators separately, and/or switch back and forth and/or toggle from any and/or all of the various possible combinations of types of display.

Figure 11:
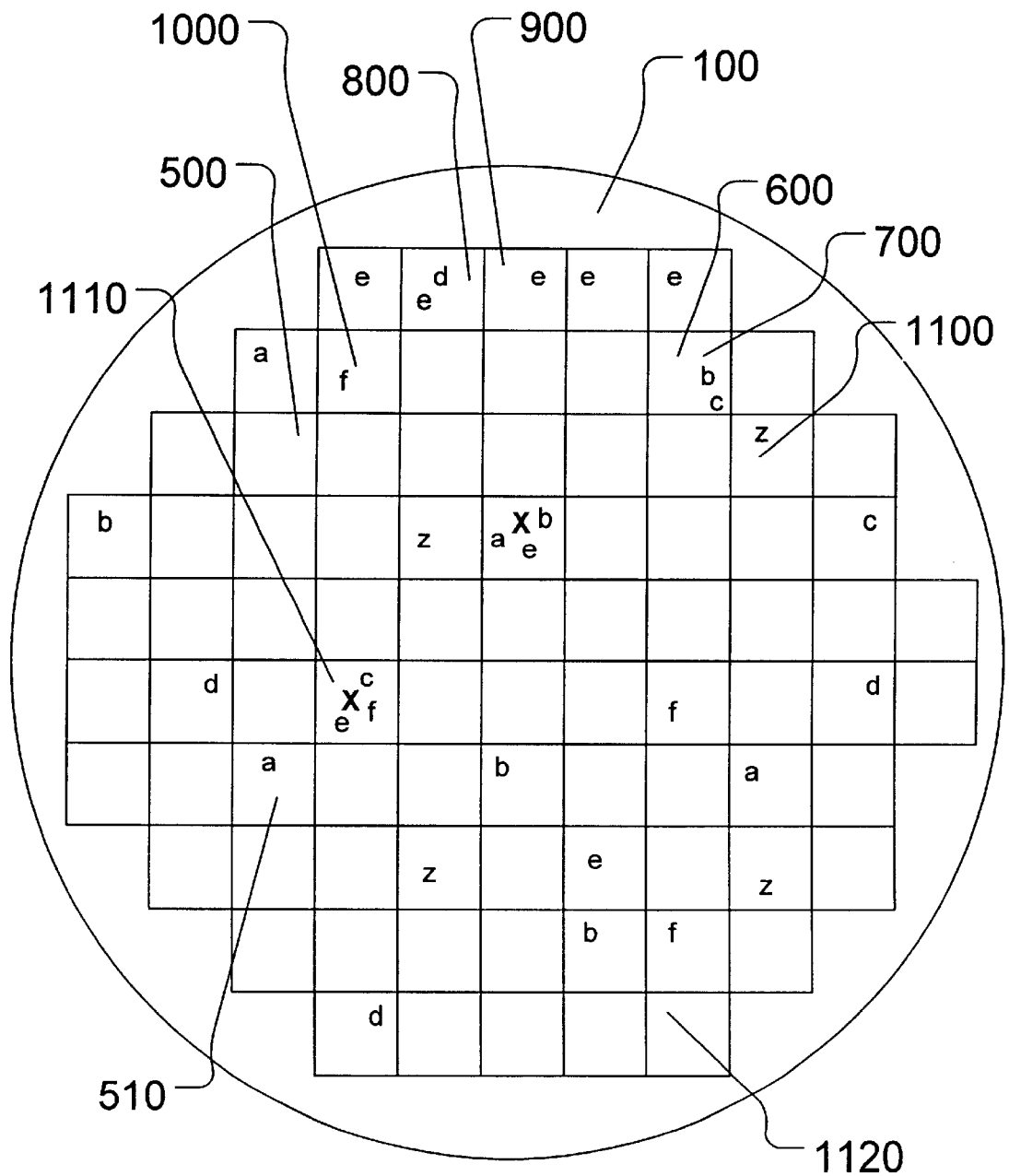

Finally, FIG. 11 schematically illustrates the display of the workpiece 100 following the final processing step N 105, for example, with the "z's" overlaid on the display showing the location of dies 1100 whose characteristics, measured in any of the preceding measurement steps j 115, indicate the presence of final issues related to the final processing step N 105, which may be the deposition of a passivation layer, and the like. As shown in FIG. 11, the final issue "z's" may be displayed simultaneously with the photolithography hotspot "a's" and/or the photolithography overlay error "b's" and/or the etch uniformity issue "c's" and/or the deposition uniformity issue "d's" and/or the polishing uniformity issue "e's." and/or the salicidation bridging issue "f's" and/or all the rest of indicators "g" through "z-1" (not shown) displaying issues related any intervening processing step j 105, for j<N. Alternatively, a process engineer, using the GUI may choose to display any and/or all of the various possible combinations of types of display.

As shown in FIG. 11, a bold X marks a die such as die 1110 that does not meet the criteria and/or specifications for a good completed or final workpiece 100. As shown in FIG. 11, such criteria may be the presence on a single die of at least three separate types of processing error and/or issue. In various alternative illustrative embodiments, the criteria may be the presence of even one type of processing error and/or issue, in which case the final workpiece 100 as shown in FIG. 11 may only yield 58 acceptable dies such as die 1120. Information concerning the one or more characteristics measured in the measuring steps j 115 (j=1 to j=N), such as the information displayed in FIGS. 5–11, may also be entered into a semiconductor device yield model, as described more fully below.

The display of the number and types of processing errors and/or issues, as in the characteristic modeling and display step 130, may be used to alert a process engineer of the need to adjust the processing performed in any of the previous processing steps (such as processing step j 105, where j may have any value from j=1 to j=N). The process engineer may also alter, for example, the type of characteristics modeled and/or displayed in the characteristic modeling and display step 130, affecting the output signal 140 produced.

FIGS. 5–11 schematically illustrate displays of processing errors and/or issues according to the present invention, and, in particular, illustrate one of many possible functionalities of various illustrative embodiments of a graphic user interface according to the present invention. Additional functionalities of various illustrative embodiments of a graphic user interface according to the present invention may include the ability to set boundary and/or filter conditions to narrow the process engineer's data viewing and analysis requirements.

For example, one set of functionalities may include the ability to set single/multiple and/or absolute/range criteria on such things as date, lot, device, layer, tool, previous tool, process step, and any other "context" and/or "state" information saved per workpiece and/or per wafer and/or per lot measurements. Another set of functionalities may include the ability to set "low" and "high" values to designate a range of values on any measured parameter, set in terms of absolute low/high (or low/hi) values, percent deviation(s) from target, standard deviation(s), and the like. Yet another set of functionalities may include the ability to designate color codings for the "a-type" through "z-type" indicators to indicate the range of deviation(s) and/or error(s), and/or possible maintenance and/or cleaning events.

Figure 12:
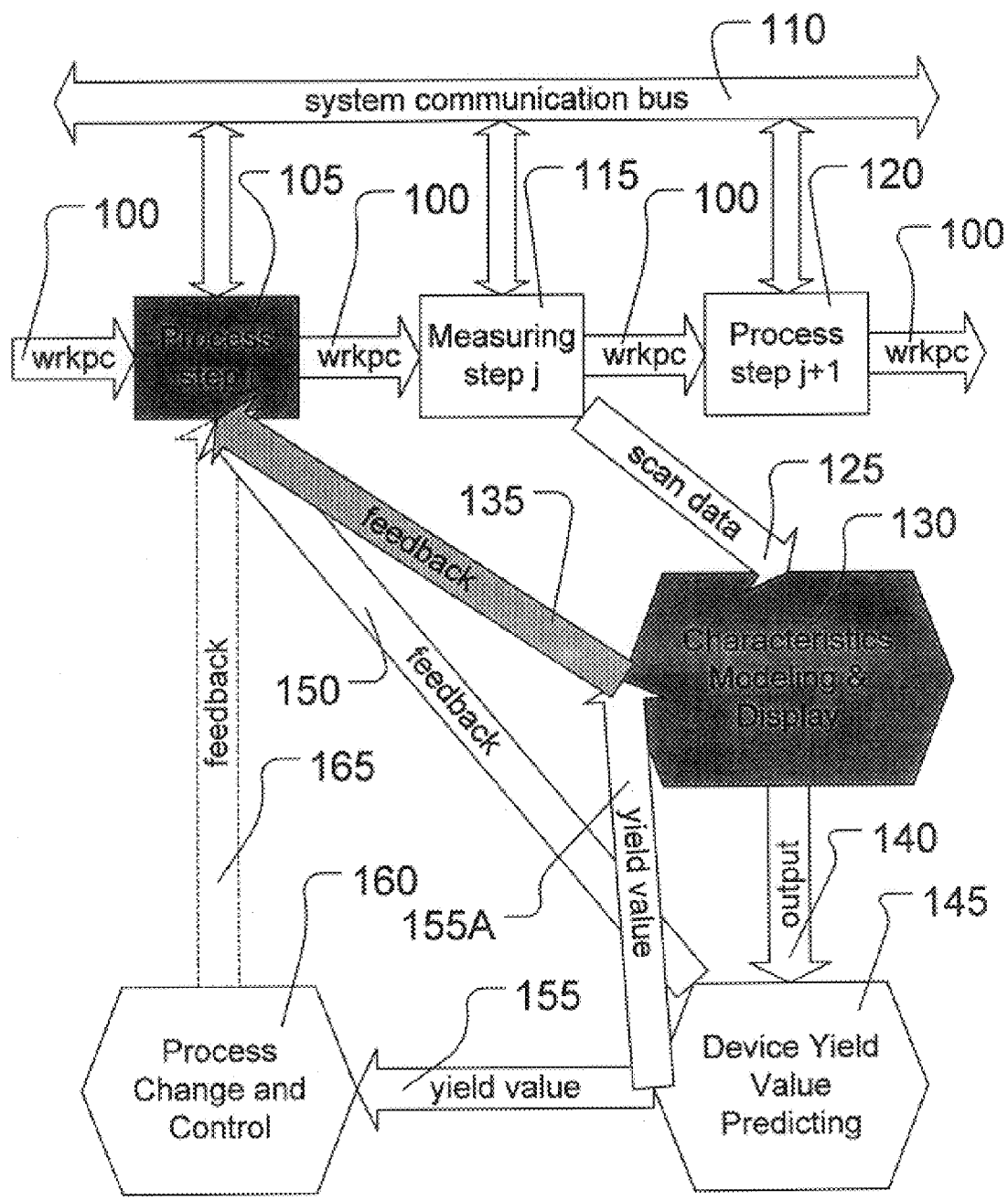

As shown in FIG. 12, a feedback control signal 135 may be sent from the characteristic modeling and display step 130 to the processing step j 105 to adjust the processing performed in the processing step j 105. In various alternative illustrative embodiments (not shown), the feedback control signal 135 may be sent from the characteristic modeling and display step 130 to any of the previous processing steps (similar to processing step j 105, where j may have any value from j=1 to j=N) to adjust the processing performed in any of the previous processing steps.

Figure 13:
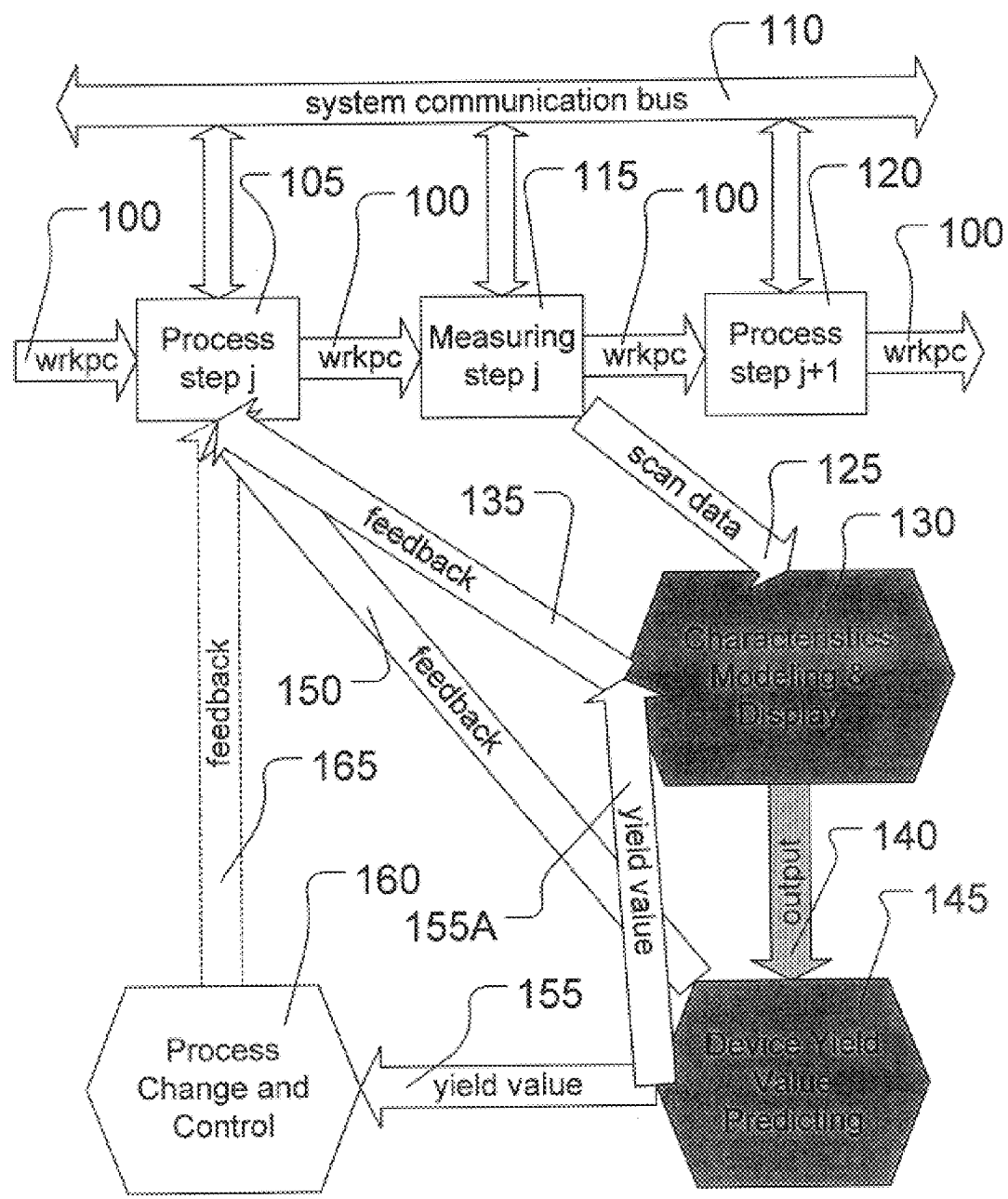

As shown in FIG. 13, the output signal 140 is sent from the characteristic modeling and display step 130 and delivered to a semiconductor device yield value predicting step 145, producing a predicted semiconductor device yield value 155 and/or a predicted semiconductor device yield value 155A, which may be identical to the predicted semiconductor device yield value 155. In the semiconductor device yield value predicting step 145, a semiconductor device yield model may be used to predict the semiconductor device yield value 155 based on the characteristics measured in the measuring steps j 115, where j may have any value from j=1 to j=N, and/or displayed in the characteristic modeling and display step 130.

In various illustrative embodiments, for example, the display of the workpiece 100 following the final processing step N 105, as shown in FIG. 11, may be correlated to the final yield value for the final workpiece 100 and/or for a statistical sample of workpieces similarly processed and/or possessing a similar pattern of processing errors and/or issues. As shown in FIG. 11, the bold X marks the die 1110 as not meeting the criteria and/or specifications for a good completed or final workpiece 100. As shown in FIG. 11, such criteria may be the presence on a single die of at least three separate types of processing error and/or issue, in which case the final workpiece 100 as shown in FIG. 11 may yield as many as 82 acceptable dies such as all dies except for dies like die 1110. In various alternative illustrative embodiments, the criteria may be the presence of even one type of processing error and/or issue, in which case the final workpiece 100 as shown in FIG. 11 may only yield 58 acceptable dies such as die 1120.

Correlations between the final semiconductor device yield and the processing performed in any of the processing steps (such as processing step j 105, where j may have any value from j=1 to j=N) may be determined systematically, by an advanced process control (APC) system, for example, by analyzing commonalties, outliers, tool state changes, and the like. These correlations may be used to build a semiconductor device yield value model and/or database and/or look-up table, and the like. Such correlations include, but are not limited to, Die Yield vs. LI (Local Interconnect) to Gate Overlay Error, Die Yield vs. Gate CD Size, and Die Yield vs. Gate Overlay to STI Edge, for example.

Figure 14:
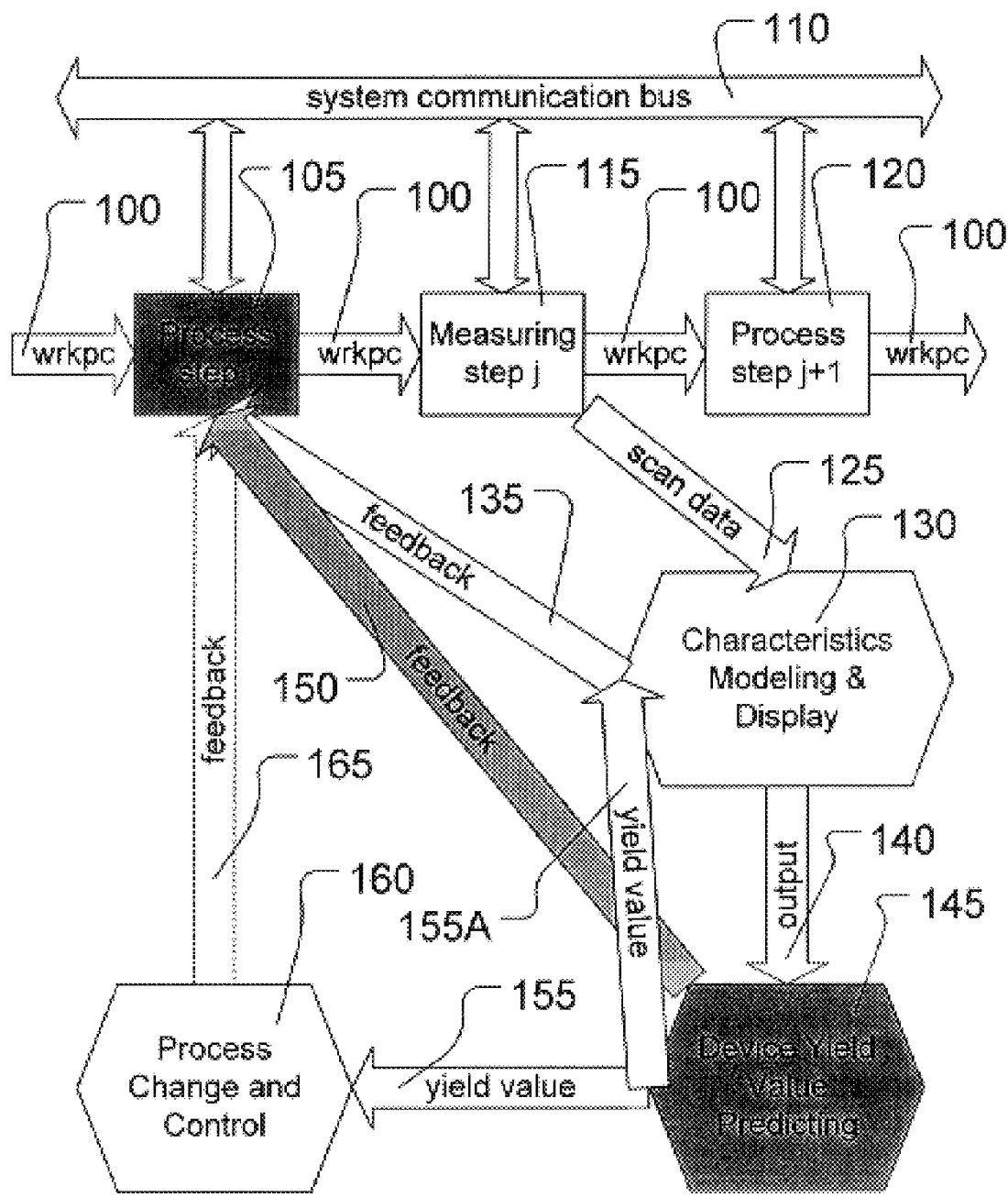

As shown in FIG. 14, in addition to, and/or instead of, the feedback control signal 135, a feedback control signal 150 may be sent from the semiconductor device yield value predicting step 145 to the processing step j 105 to adjust the processing performed in the processing step j 105. In various alternative illustrative embodiments (not shown), the feedback control signal 150 may be sent from the semiconductor device yield value predicting step 145 to any of the previous processing steps (similar to processing step j 105, where j may have any value from j=1 to j=N) to adjust the processing performed in any of the previous processing steps.

Figure 15:
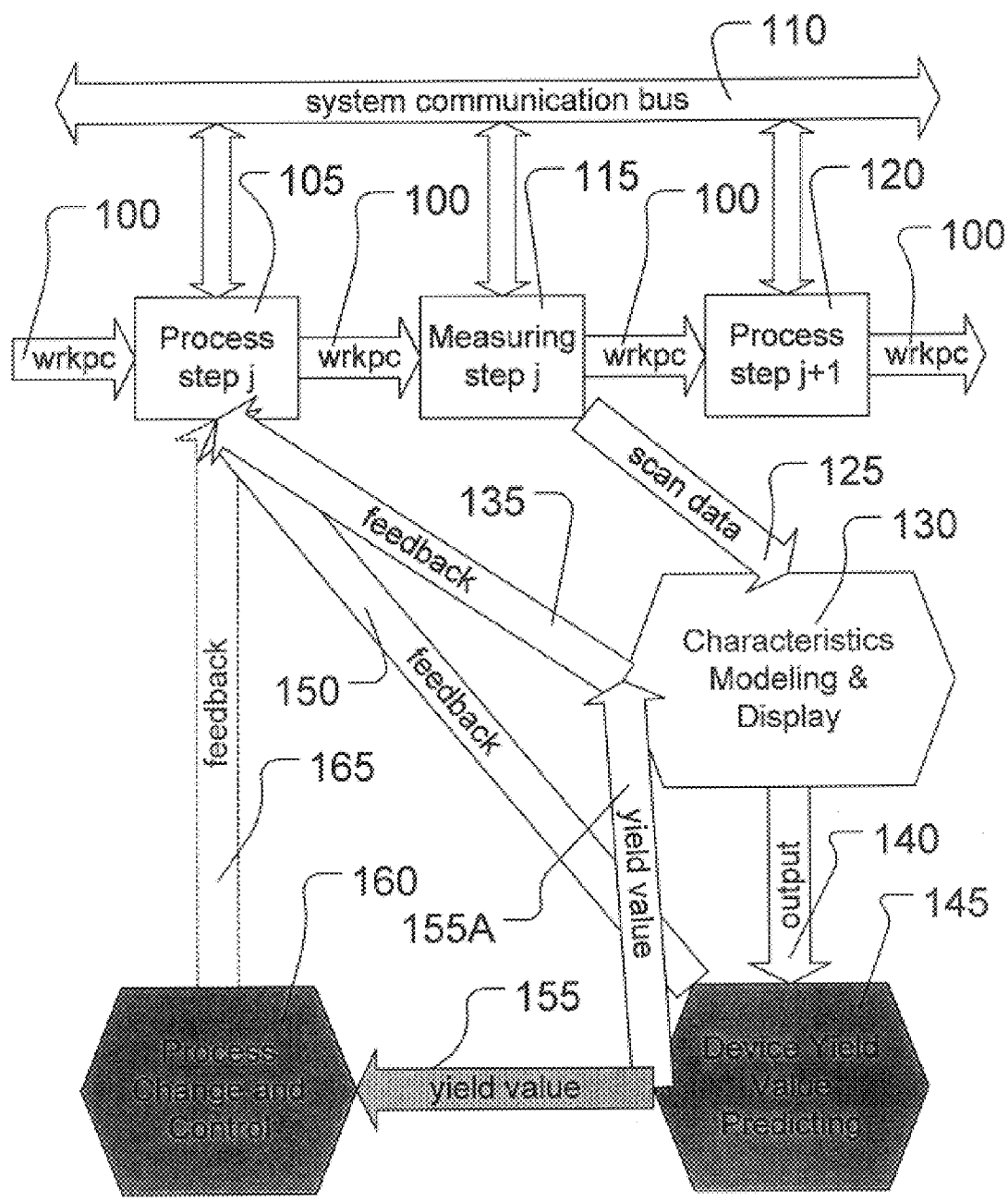
Figure 16:
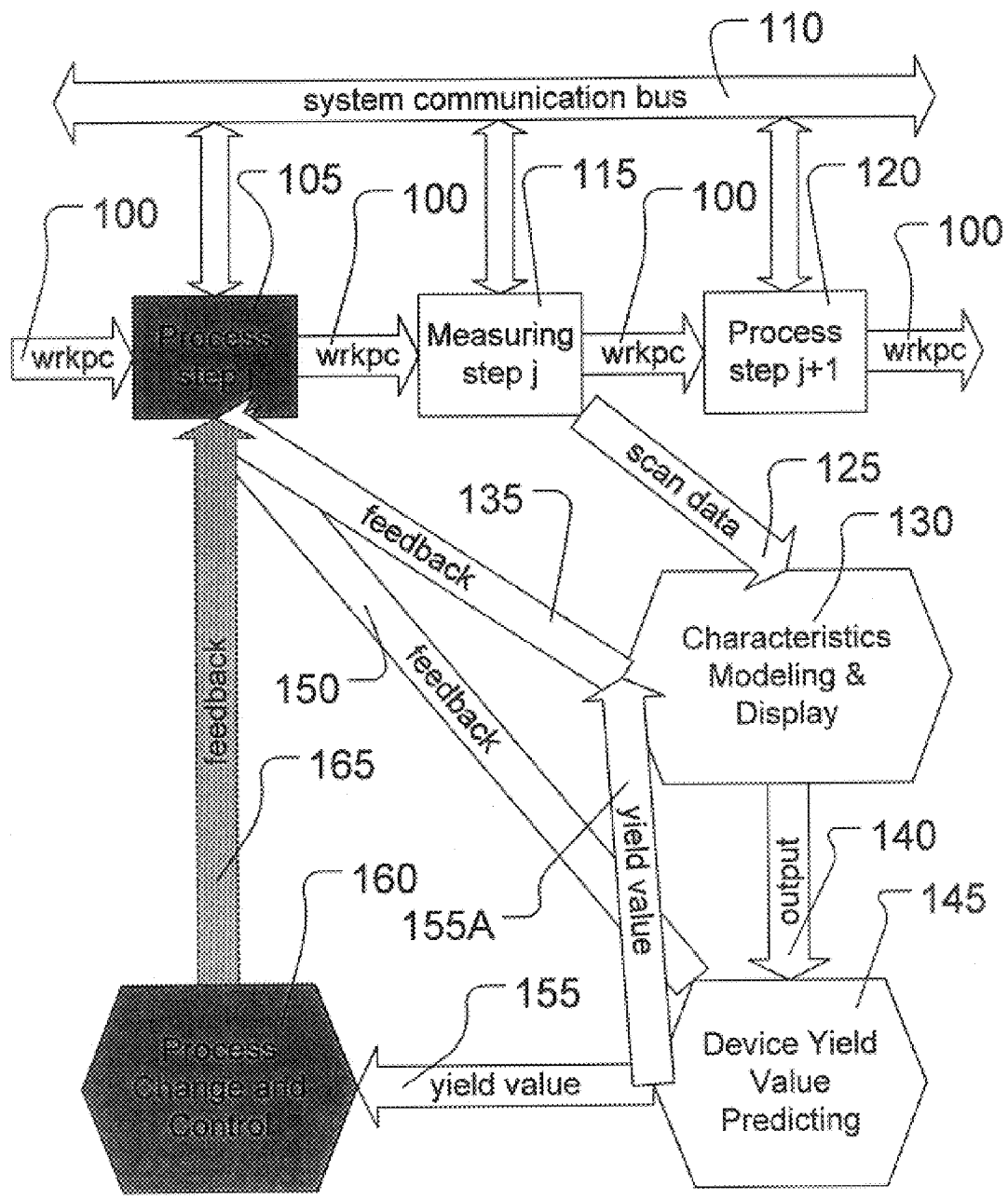

As shown in FIG. 15, in addition to, and/or instead of, the feedback control signals 135 and/or 150, the predicted semiconductor device yield value(s) 155 may be sent from the semiconductor device yield value predicting step 145 to a process change and control step 160. In the process change and control step 160, the predicted semiconductor device yield value(s) 155 may be used in a high-level supervisory control loop and/or used to detect faulty processing performed in any of the previous processing steps (such as processing step j 105, where j may have any value from j=1 to j=N). Thereafter, as shown in FIG. 16, a feedback 165 (shown in phantom) may be sent from the process change and control step 150 to process engineers (not shown) who then manually implement required process changes and controls to be applied to the processing step j 105 to adjust and/or correct the processing performed on subsequent workpieces in the processing step j 105. In various alternative illustrative embodiments (not shown), the feedback 165 (shown in phantom) may be sent from the process change and control step 150 to process engineers (not shown) who then manually implement required process changes and controls to be applied to any of the previous processing steps (similar to processing step j 105, where j may have any value from j=1 to j=N) to adjust and/or correct the processing performed in any of the previous processing steps.

Figure 17:
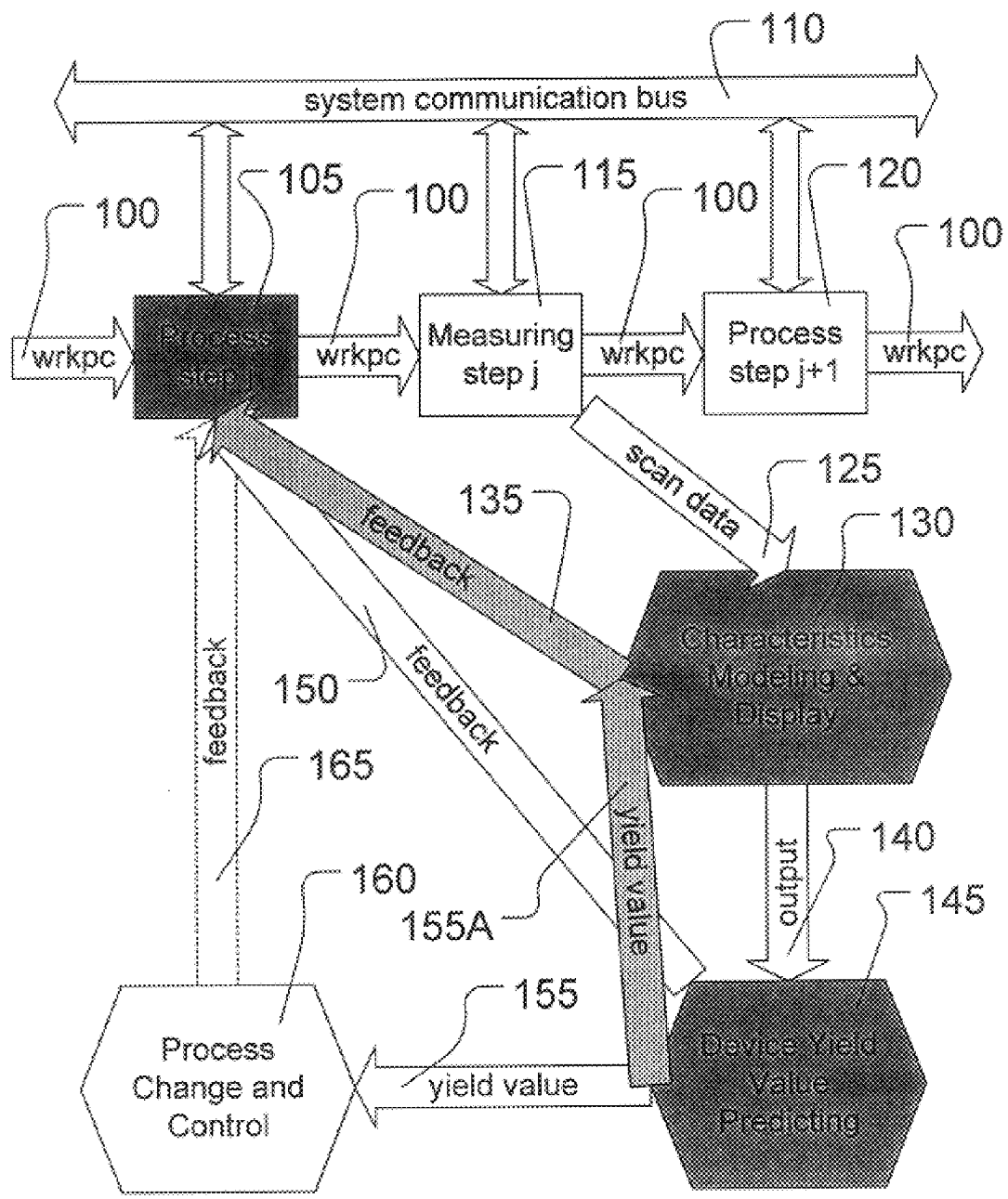

As shown in FIG. 17, in addition to, and/or instead of, the feedback control signals 135 and/or 150 and/or feedback 165 (shown in phantom), the predicted semiconductor device yield value(s) 155A may be sent from the semiconductor device yield value predicting step 145 to the characteristic modeling and display step 130. As shown in FIG. 11, the predicted semiconductor device yield value(s) 155A may be displayed along with the display of the number and types of processing errors and/or issues. As shown in FIG. 17, one possible response to the receipt of the predicted semiconductor device yield value(s) 155A may be the sending of the feedback control signal 135 from the characteristic modeling and display step 130 to the processing step j 105 to adjust and/or correct the processing performed in the processing step j 105, as discussed above in reference to FIG. 12.

In various illustrative embodiments, the processing characteristic values $y_\alpha$, $\alpha=1$ to $\alpha=m$, obtained using in-line process metrology and/or sensors and/or fault detectors, and the like, may be mapped to predicted semiconductor device yield values $x_\beta$, $\beta=1$ to $\beta=n$, in the completed workpiece 100 by the mapping $T^{-1}(y_\alpha)=x_\beta$. The characteristic values $y_\alpha$, $\alpha=1$ to $\alpha=m$, may be represented as m vectors each having s components, or, equivalently, as an s×m matrix $Y_{s \times m}$, whose m columns are the m vectors $y_\alpha$, $\alpha=1$ to $\alpha=m$:

$$Y_{s \times m} = (y_\alpha) = (y_1 \cdots y_m) = (y_{\beta\alpha}) = \begin{pmatrix} y_{11} & \cdots & y_{1m} \\ \vdots & \ddots & \vdots \\ y_{sl} & \cdots & y_{sm} \end{pmatrix}.$$

Similarly, the predicted semiconductor device yield values $x_\beta$, $\beta=1$ to $\beta=n$, may be represented as n vectors each having t components, or, equivalently, as an t×n matrix $X_{t \times n}$, whose n columns are the n vectors $x_\beta$, $$\beta = 1 \text{ to } \beta = n: \quad X_{t \times n} = (x_\alpha) = (x_1 \cdots x_m)$$

$$= (x_{\beta\alpha}) = \begin{pmatrix} x_{11} & \cdots & x_{1n} \\ \vdots & \ddots & \vdots \\ x_{tl} & \cdots & x_{tn} \end{pmatrix}.$$

In various illustrative embodiments, the mapping $T^{-1}(y_\alpha) = x_\beta$, may be represented as multiplication of the s×m matrix $Y_{s \times m}$ by the t×s matrix $L_{t \times s}$ on the left and by the m×n matrix $R_{m \times n}$, on the right:

$$L_{t \times s} Y_{s \times m} R_{m \times n} = X_{t \times n}$$

$$= \begin{pmatrix} l_{11} & \cdots & l_{1s} \\ \vdots & \ddots & \vdots \\ l_{tl} & \cdots & l_{ts} \end{pmatrix} \begin{pmatrix} y_{11} & \cdots & y_{1m} \\ \vdots & \ddots & \vdots \\ y_{sl} & \cdots & y_{sm} \end{pmatrix} \begin{pmatrix} r_{11} & \cdots & r_{1n} \\ \vdots & \ddots & \vdots \\ r_{ml} & \cdots & r_{mn} \end{pmatrix}$$

$$= \begin{pmatrix} x_{11} & \cdots & x_{1n} \\ \vdots & \ddots & \vdots \\ x_{tl} & \cdots & x_{tn} \end{pmatrix}.$$

The mapping $T^{-1}(y_\alpha) = x_\beta$ of the characteristic values $y_\alpha$, $\alpha=1$ to $\alpha=m$, obtained using in-line process metrology and/or sensors and/or fault detectors, and the like, onto the predicted semiconductor device yield values $x_\beta$, $\beta=1$ to $\beta=n$, in the completed workpiece 100 may be used on-line to detect and/or correct errant processing that might cause the completed workpiece 100 to be consigned to scrap, thereby reducing wasted material and increasing throughput of corrected completed workpieces 100. For example, in various illustrative embodiments, the mapping $T^{-1}(y_\alpha) = x_\beta$ may be inverted $y_\alpha = T(x_\beta)$ to define one or more changes in the processing performed in any of the previous processing steps (such as processing step j 105, where j may have any value from j=1 to j=N) that need to be made to bring the one or more characteristic values $y_\alpha$, $\alpha=1$ to $\alpha=m$, measured in the measuring step j 110, within a range of specification values.

In various alternative illustrative embodiments, the characteristic value measurements, represented generally by a vector e, may be put into a semiconductor device yield model, represented generally by a function Y(e), which maps the characteristic value measurements e into a measure of the semiconductor device yield, represented generally by a scalar y, characteristic of the processing performed in at least one of the processing steps j 105, where j may have any value from j=1 to j=N−1, so that Y(e)=y. The semiconductor device yield model may be optimized by finding the maximum of Y(e)=y, with respect to variations in the characteristic value measurements e.

For example, if $Y(e) = y = Y(|e|) = |e|^n \exp(-a|e|)$, then the condition $\partial Y(|e|)/\partial |e| = 0 = n|e|^{n-1} \exp(-a|e|) - a|e|^n \exp(-a|e|) = (n - a|e|)|e|^{n-1} \exp(-a|e|)$ defines the extrema of $Y(e) = y = Y(|e|) = |e|^n \exp(-a|e|)$. The further condition $\partial Y(|e|)/\partial |e|^2 = -a|e|^{n-1} \exp(-a|e|) < 0$ at $n = a|e|$ confirms that $n = a|e|$ maximizes $Y(e) = y = Y(|e|) = |e|^n \exp(-a|e|)$.

In various other illustrative embodiments, the information concerning the one or more characteristics measured in the measuring steps j 115 (j=1 to j=N), such as the information displayed in FIGS. 5–11, may also be entered into a semiconductor device yield model that determines the semiconductor device yield without having to display the information. For example, each die such as die 500 shown in FIG. 5 may be assigned a consecutive prime number p(i), for i=1 to n, the total number of dies 500 formed on the workpiece 100 (n=84 in FIGS. 5–11), starting at the upper left die and ending at the lower right die; p(1)=2, p(2)=3, p(3)=5, p(4)=7, p(5)=11, p(6)=13, p(7)=17, p(8)=19, p(9)=23, p(10)=29, and so forth, a prime number being any number greater than or equal to 2 that is divisible (without remainder) only by 1 and itself In addition, each type of processing error and/or issue may also be assigned a consecutive prime number a(k), for k=1 to z, z being the total number of processing errors and/or issues identified. The absence of any type of processing error and/or issue may be signaled by assigning a(k)=1, for k=1 to z. For example, an "a-type" error may be assigned a(1)=2, absence of an "a-type" error may be assigned a(1)=1, a "b-type" error may be assigned a(2)=3, absence of a "b-type" error may be assigned a(2)=1, a "c-type" error may be assigned a(3)=5, absence of a "c-type" error may be assigned a(3)=1, a "d-type" error may be assigned a(4)=7, absence of a "d-type" error may be assigned a(4)=1, an "e-type " error may be assigned a(5)=1, absence of an "e-type" error may be assigned a(5)=1, an "f-type " error may be assigned a(6)=13, absence of an "f-type" error may be assigned a(6)=1, a "z-type" error may be assigned a(7)=17, and absence of a "z-type" error may be assigned a(7)=1, assuming that there are only 7 types of processing errors and/or issues that are specifically identified.

Then, a number representing the types of processing errors and/or issues for each die may be obtained by multiplying together the numbers a(k) associated with each die. For example, the number representing the types of processing errors and/or issues for the first of the dies 800, as shown in FIG. 11, is a(4)a(5)=7×11=77. Similarly, the number representing the types of processing errors and/or issues for die 1110, as shown in FIG. 11, is a(3)a(5)a(6)=5×11×13=715. Note that the number representing the types of processing errors and/or issues for die 1120, as shown in FIG. 11, is a(1)a(2)a(3)a(4)a(5)a(6)a(7)=1×1×1×1×1×1×1=1.

Thereafter, a unique number representing the types of processing errors and/or issues on a die-by-die basis may be obtained by raising the prime p(i) corresponding to each die by the number obtained by multiplying together the numbers a(k) associated with each die. For example, the unique number representing the first of the dies 800 along with the types of processing errors and/or issues for that die 800, as shown in FIG. 11, is $p(2)^{a(4)a(5)} = 3^{7 \times 11} = 3^{77}$. Similarly, the unique number representing the first of the dies 900 along with the types of processing errors and/or issues for that die, as shown in FIG. 11, is $p(1)^{a(5)} = 2^{11} = 4024$, and the unique number representing the third of the dies 900 along with the types of processing errors and/or issues for that die, as shown in FIG. 11, is $p(3)^{a(5)} = 5^{11}$. Note that the unique number representing die 1120 along with the types of processing errors and/or issues for die 1120, as shown in FIG. 11, is $p(84)^{a(0)} = p(84)^1 = p(84) = 433$.

Finally, a unique number representing all the types of processing errors and/or issues for all the dies 500 on the workpiece 100 may be obtained by multiplying together all the numbers $p(i)^{a(k)a(l) \cdots a(m)}$ associated with each die. In other words, the unique number representing all the types of processing errors and/or issues for all the dies 500 on the workpiece 100 may be obtained by calculating the number given by the expression:

$$E(n, z) = \prod_{i=1}^{i=n} p(i)^{\prod_{k=1}^{k=z} a(k)} = \prod_{i=1}^{i=84} p(i)^{\prod_{k=1}^{k=7} a(k)} = E(84, 7),$$

for n=84 and z=7. The types of processing errors and/or issues for the ith die 500 may be determined by dividing E(n,z) by p(i) and counting the number of times E(n,z) is divided by p(i) without remainder. For example, E(84,7) may be divided by p(84)=433 only once without remainder, since a(k)=1 for k=1 to k=7 for die 1120, as shown in FIG. 11. Similarly, E(84,7) may be divided by p(2)=3 fully 77 times without remainder, since a(4)=7, a(5)=11 and a(k)=1 for k =1, 2 3, 6 and 7 for the first of dies 800, as shown in FIG. 11.

By construction, the unique prime factorization of the number of times E(n,z) may be divided by p(i) without remainder reveals the types of processing errors and/or issues for the ith die 500. For example, since E(84,7) may be divided by p(84)=433 only once without remainder, die 1120 must be free of all the identified types of processing errors and/or issues, as shown in FIG. 11. Similarly, since E(84,7) may be divided by p(2)=3 fully 77 times without remainder, and since a(4)=7, a(5)=11, the first of dies 800 must have both an "e-type" and an "f-type" of processing error and/or issue, as shown in FIG. 11.

In various illustrative embodiments, the engineer may be provided with advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

Figure 18:
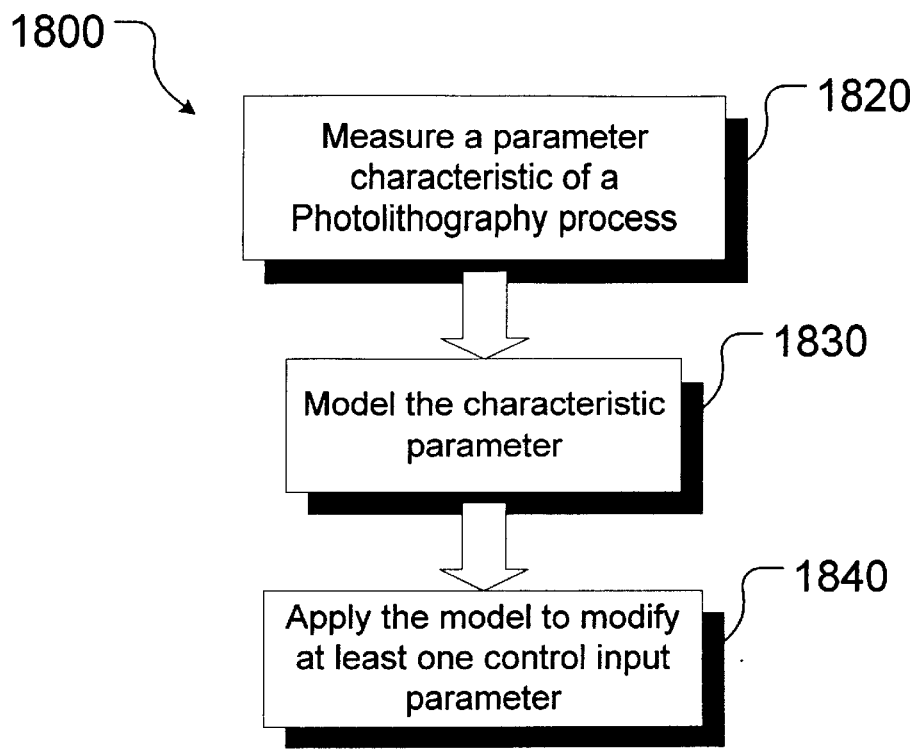
Figure 19:
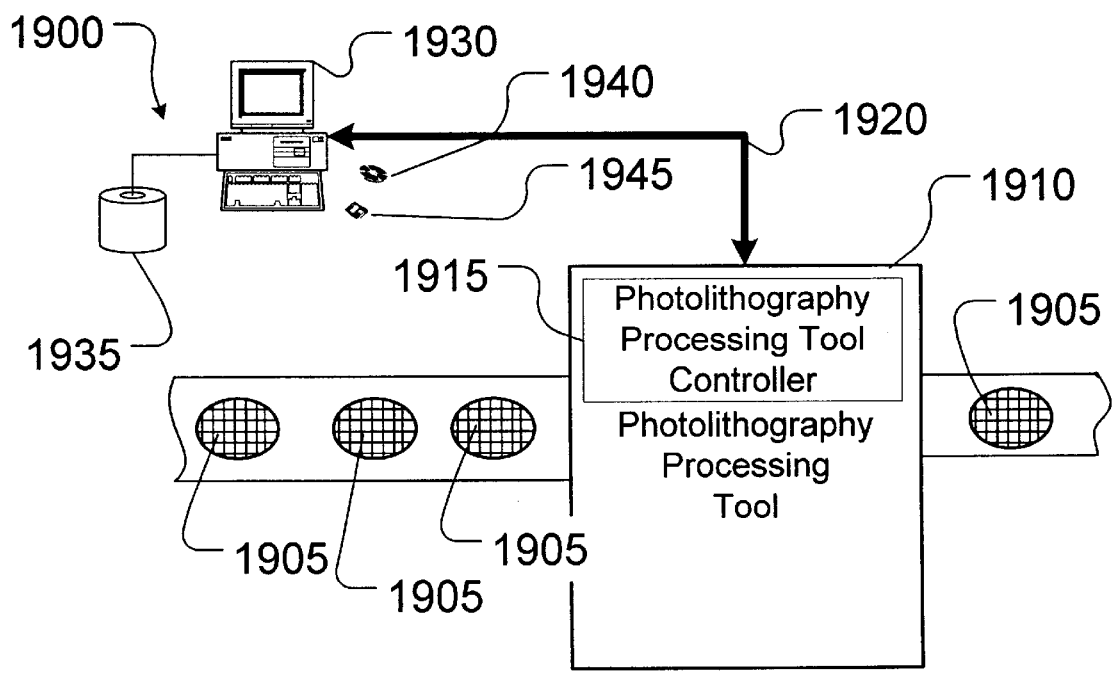

FIG. 18 illustrates one particular embodiment of a method 1800 practiced in accordance with the present invention, and, in particular, exemplifies the handling of photolithography overlay errors indicated by "b-type" indicators, for example, as described above in reference to FIG. 6. Embodiments relating to the other "a-type" through "z-type" indicators may be similarly implemented. FIG. 19 illustrates one particular apparatus 1900 with which the method 1800 may be practiced. For the sake of clarity, and to further an understanding of the invention, the method 1800 shall be disclosed in the context of the apparatus 1900. However, the invention is not so limited and admits wide variation, as is discussed further below.

Referring now to both FIGS. 18 and 19, a batch or lot of workpieces or wafers 1905 is being processed through a photolithography processing tool 1910. The photolithography processing tool 1910 may be any photolithography processing tool known to the art, provided it includes the requisite control capabilities. The photolithography processing tool 1910 includes a photolithography processing tool controller 1922 for this purpose. The nature and function of the photolithography processing tool controller 1922 will be implementation specific. For instance, the photolithography processing tool controller 1922 may control photolithography control input parameters such as a "stepper" x-translation signal, a stepper y-translation signal, an x-expansion wafer scale signal, a y-expansion wafer scale signal, a reticle magnification signal, and a reticle rotation signal, and the like. Four workpieces 1905 are shown in FIG. 19, but the lot of workpieces or wafers, ie., the "wafer lot," may be any practicable number of wafers from one to any finite number.

The method 1800 begins, as set forth in box 1820, by measuring a parameter characteristic of the photolithography processing performed on the workpiece 1905 in the photolithography processing tool 1910. The nature, identity, and measurement of characteristic parameters will be largely implementation specific and even tool specific. For instance, capabilities for monitoring process parameters vary, to some degree, from tool to tool. Greater sensing capabilities may permit wider latitude in the characteristic parameters that are identified and measured and the manner in which this is done. Conversely, lesser sensing capabilities may restrict this latitude. For example, a photolithography tool may read the photolithography overlay error (POE) of features on a workpiece 1905 (see FIGS. 4–5), and/or an average of the POE's of the workpieces 1905 in a lot, using a metrology tool (not shown), but this metrology tool may vary from wafer to wafer depending on the ambient temperature of the wafer(s). The POE metrology tool typically does not feedback the POE information to the photolithography tool. The POE of a workpiece 1905, and/or an average of the POE's of the workpieces 1905 in a lot, is an illustrative example of a parameter characteristic of the photolithography processing performed on the workpiece in the photolithography processing tool 1910.

Turning to FIG. 19, in this particular embodiment, the photolithography process characteristic parameters are measured and/or monitored by tool sensors (not shown). The outputs of these tool sensors are transmitted to a computer system 1930 over a line 1920. The computer system 1930 analyzes these sensor outputs to identify the characteristic parameters.

Returning, to FIG. 18, once the characteristic parameter is identified and measured, the method 1800 proceeds by modeling the measured and identified characteristic parameter, as set forth in box 1830. The computer system 1930 in FIG. 19 is, in this particular embodiment, programmed to model the characteristic parameter. The manner in which this modeling occurs will be implementation specific.

In the embodiment of FIG. 19, a database 1935 stores a plurality of models that might potentially be applied, depending upon which characteristic parameter is identified. This particular embodiment, therefore, requires some a priori knowledge of the characteristic parameters that might be measured. The computer system 1930 then extracts an appropriate model from the database 1935 of potential models to apply to the identified characteristic parameters. If the database 1935 does not include an appropriate model, then the characteristic parameter may be ignored, or the computer system 1930 may attempt to develop one, if so programmed. The database 1935 may be stored on any kind of computer-readable, program storage medium, such as an optical disk 1940, a floppy disk 1945, or a hard disk drive (not shown) of the computer system 1930. The database 1935 may also be stored on a separate computer system (not shown) that interfaces with the computer system 1930.

Modeling of the identified characteristic parameter may be implemented differently in alternative embodiments. For instance, the computer system 1930 may be programmed using some form of artificial intelligence to analyze the sensor outputs and controller inputs to develop a model on-the-fly in a real-time implementation. This approach might be a useful adjunct to the embodiment illustrated in FIG. 19, and discussed above, where characteristic parameters are measured and identified for which the database 1935 has no appropriate model.

The method 1800 of FIG. 18 then proceeds by applying the model to modify a photolithography control input parameter, as set forth in box 1840. Depending on the implementation, applying the model may yield either a new value for the photolithography control input parameter or a correction to the existing photolithography control input parameter. The new photolithography control input is then formulated from the value yielded by the model and is transmitted to the photolithography processing tool controller 1922 over the line 1920. The photolithography processing tool controller 1922 then controls subsequent photolithography process operations in accordance with the new photolithography control inputs.

Some alternative embodiments may employ a form of feedback to improve the modeling of characteristic parameters. The implementation of this feedback is dependent on several disparate facts, including the tool's sensing capabilities and economics. One technique for doing this would be to monitor at least one effect of the model's implementation and update the model based on the effect(s) monitored. The update may also depend on the model. For instance, a linear model may require a different update than would a non-linear model, all other factors being the same.

As is evident from the discussion above, some features of the present invention are implemented in software. For instance, the acts set forth in the boxes 1820–1840 in FIG. 18 are, in the illustrated embodiment, software-implemented, in whole or in part. Thus, some features of the present invention are implemented as instructions encoded on a computer-readable, program storage medium. The program storage medium may be of any type suitable to the particular implementation. However, the program storage medium will typically be magnetic, such as the floppy disk 1945 or the computer 1930 hard disk drive (not shown), or optical, such as the optical disk 1940. When these instructions are executed by a computer, they perform the disclosed functions. The computer may be a desktop computer, such as the computer 1930. However, the computer might alternatively be a processor embedded in the photolithography processing tool 1910. The computer might also be a laptop, a workstation, or a mainframe in various other embodiments. The scope of the invention is not limited by the type or nature of the program storage medium or computer with which embodiments of the invention might be implemented.

Thus, some portions of the detailed descriptions herein are, or may be, presented in terms of algorithms, functions, techniques, and/or processes. These terms enable those skilled in the art most effectively to convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electromagnetic signals capable of being stored, transferred, combined, compared, and otherwise manipulated.

It has proven convenient at times, principally for reasons of common usage, to refer to these signals as bits, values, elements, symbols, characters, terms, numbers, and the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," and the like, used herein refer to the action(s) and processes of a computer system, or similar electronic and/or mechanical computing device, that manipulates and transforms data, represented as physical (electromagnetic) quantities within the computer system's registers and/or memories, into other data similarly represented as physical quantities within the computer system's memories and/or registers and/or other such information storage, transmission and/or display devices.

Construction of an Illustrative Apparatus

Figure 20:
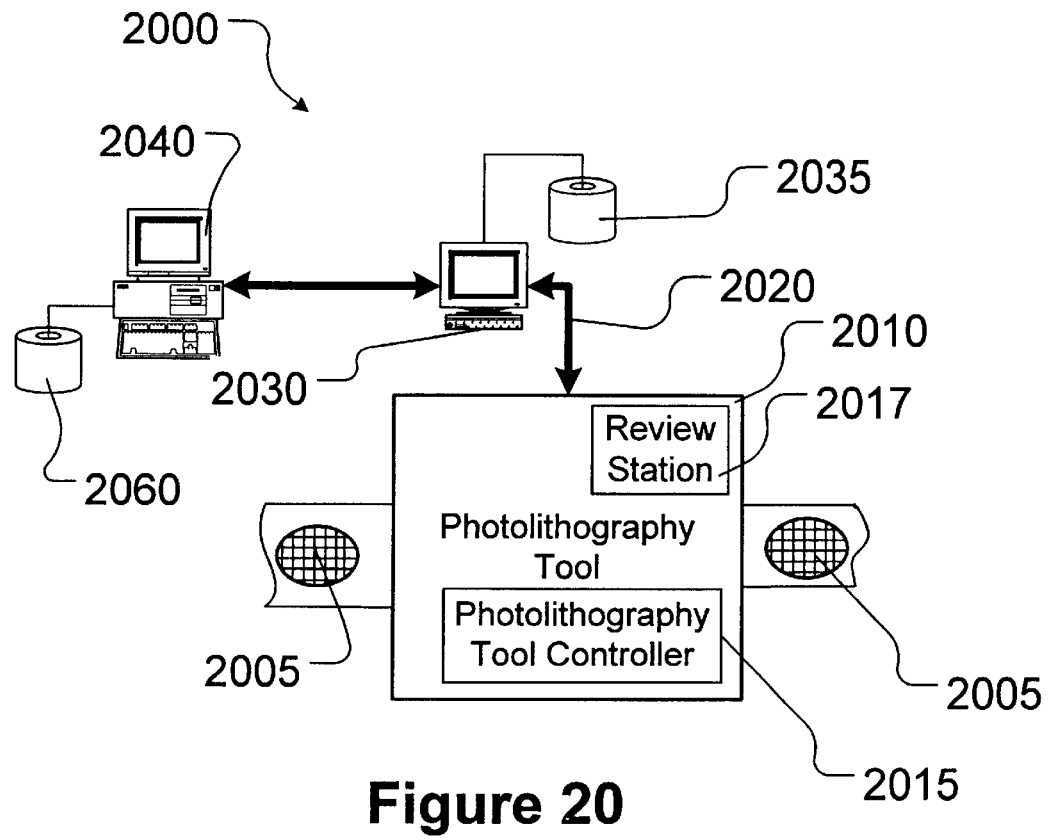
Figure 21:
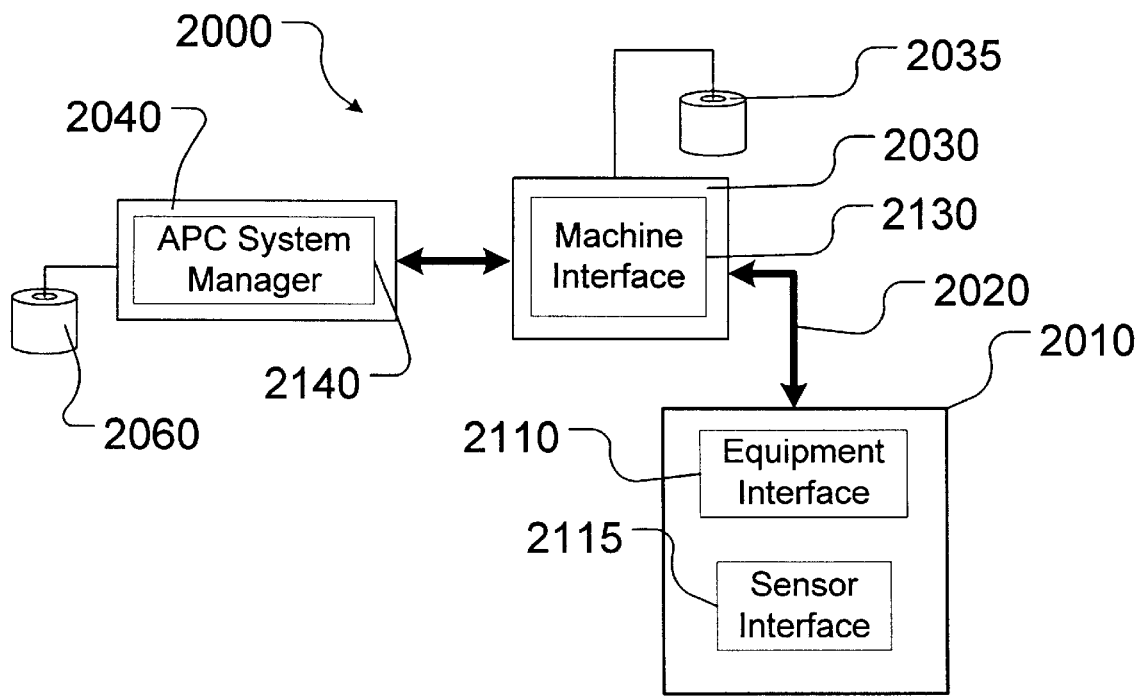

An exemplary embodiment 2000 of the apparatus 1900 in FIG. 19 is illustrated in FIGS. 20–21, in which the apparatus 2000 comprises a portion of an Advanced Process Control ("APC") system. FIGS. 20–21 are conceptualized, structural and functional block diagrams, respectively, of the apparatus 2000. A set of processing steps is performed on a lot of wafers 2005 on a photolithography processing tool 2010. Because the apparatus 2000 is part of an APC system, the wafers 2005 are processed on a run-to-run basis. Thus, process adjustments are made and held constant for the duration of a run, based on run-level measurements or averages. A "run" may be a lot, a batch of lots, or even an individual wafer.

In this particular embodiment, the wafers 2005 are processed by the photolithography processing tool 2010 and various operations in the process are controlled by a plurality of photolithography control input signals on a line 2020 between the photolithography processing tool 2010 and a workstation 2030. Exemplary photolithography control inputs for this embodiment might include a stepper x-translation signal, a stepper y-translation signal, an x-expansion wafer scale signal, a y-expansion wafer scale signal, a reticle magnification signal, and a reticle rotation signal, and the like.

When a process step in the photolithography processing tool 2010 is concluded, the semiconductor wafers 2005 being processed in the photolithography processing tool 2010 are examined in a review station 2017. The photolithography control inputs generally affect the POE of the semiconductor wafers 2005 and, hence, the variability and properties of the features patterned by the photolithography processing tool 2010 on the wafers 2005. Once errors are determined from the examination after the run of a lot of wafers 2005, the photolithography control inputs on the line 2020 are modified for a subsequent run of a lot of wafers 2005. Modifying the control signals on the line 2020 is designed to improve the next process step in the photolithography processing tool 2010. The modification is performed in accordance with one particular embodiment of the method 1800 set forth in FIG. 18, as described more fully below. Once the relevant photolithography control input signals for the photolithography processing tool 2010 are updated, the photolithography control input signals with new settings are used for a subsequent run of semiconductor devices.

Referring now to both FIGS. 20 and 21, the photolithography processing tool 2010 communicates with a manufacturing framework comprising a network of processing modules. One such module is an APC system manager 2140 resident on the computer 2040. This network of processing modules constitutes the APC system. The photolithography processing tool 2010 generally includes an equipment interface 2110 and a sensor interface 2122. A machine interface 2130 resides on the workstation 2030. The machine interface 2130 bridges the gap between the APC framework, e.g., the APC system manager 2140, and the equipment interface 2110. Thus, the machine interface 2130 interfaces the photolithography processing tool 2010 with the APC framework and supports machine setup, activation, monitoring, and data collection. The sensor interface 2122 provides the appropriate interface environment to communicate with external sensors such as LabView® or other sensor bus-based data acquisition software. Both the machine interface 2130 and the sensor interface 2122 use a set of functionalities (such as a communication standard) to collect data to be used. The equipment interface 2110 and the sensor interface 2122 communicate over the line 2020 with the machine interface 2130 resident on the workstation 2030.

More particularly, the machine interface 2130 receives commands, status events, and collected data from the equipment interface 2110 and forwards these as needed to other APC components and event channels. In turn, responses from APC components are received by the machine interface 2130 and rerouted to the equipment interface 2110. The machine interface 2130 also reformats and restructures messages and data as necessary. The machine interface 2130 supports the startup/shutdown procedures within the APC System Manager 2140. It also serves as an APC data collector, buffering data collected by the equipment interface 2110, and emitting appropriate data collection signals.

In the particular embodiment illustrated, the APC system is a factory-wide software system, but this is not necessary to the practice of the invention. The control strategies taught by the present invention can be applied to virtually any semiconductor photolithography processing tool on a factory floor. Indeed, the present invention may be simultaneously employed on multiple photolithography processing tools in the same factory or in the same fabrication process. The APC framework permits remote access and monitoring of the process performance. Furthermore, by utilizing the APC framework, data storage can be more convenient, more flexible, and less expensive than data storage on local drives. However, the present invention may be employed, in some alternative embodiments, on local drives.

The illustrated embodiment deploys the present invention onto the APC framework utilizing a number of software components. In addition to components within the APC framework, a computer script is written for each of the semiconductor photolithography processing tools involved in the control system. When a semiconductor photolithography processing tool in the control system is started in the semiconductor manufacturing fab, the semiconductor photolithography processing tool generally calls upon a script to initiate the action that is required by the photolithography processing tool controller. The control methods are generally defined and performed using these scripts. The development of these scripts can comprise a significant portion of the development of a control system.

In this particular embodiment, there are several separate software scripts that perform the tasks involved in controlling the photolithography processing operation. There is one script for the photolithography processing tool 2010, including the review station 2017 and the photolithography processing tool controller 2022. There is also a script to handle the actual data capture from the review station 2017 and another script that contains common procedures that can be referenced by any of the other scripts. There is also a script for the APC system manager 2140. The precise number of scripts, however, is implementation specific and alternative embodiments may use other numbers of scripts.

Operation of an Illustrative Apparatus

Figure 22:
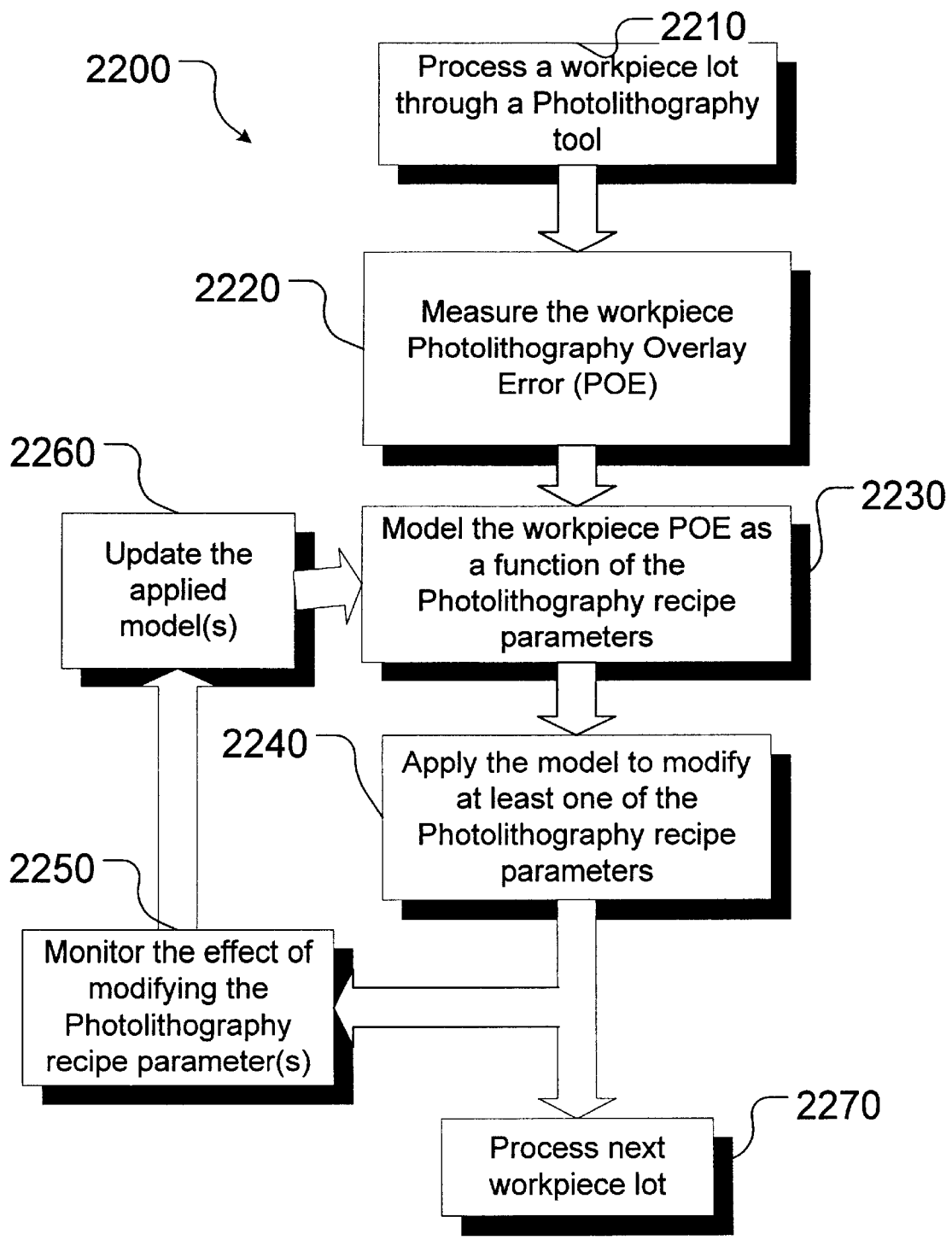

FIG. 22 illustrates one particular embodiment 2200 of the method 1800 in FIG. 18. The method 2200 may be practiced with the apparatus 2000 illustrated in FIGS. 20–21, but the invention is not so limited. The method 2200 may be practiced with any apparatus that may perform the functions set forth in FIG. 22. Furthermore, the method 1800 in FIG. 18 may be practiced in embodiments alternative to the method 2200 in FIG. 22.

Referring now to all of FIGS. 20–22, the method 2200 begins with processing a lot of wafers 2005 through a photolithography processing tool 2010, as set forth in box 2210. In this particular embodiment, the photolithography processing tool 2010 has been initialized for processing by the APC system manager 2140 through the machine interface 2130 and the equipment interface 2110. In this particular embodiment, before the photolithography processing tool 2010 is run, the APC system manager script is called to initialize the photolithography processing tool 2010. At this step, the script records the identification number of the photolithography processing tool 2010 and the lot number of the wafers 2005. The identification number is then stored against the lot number in a data store 2060. The rest of the script, such as the APCData call and the Setup and Start-Machine calls, are formulated with blank or dummy data in order to force the machine to use default settings.

As part of this initialization, the initial setpoints for photolithography control are provided to the photolithography processing tool controller 2022 over the line 2020. These initial setpoints may be determined and implemented in any suitable manner known to the art. In the particular embodiment illustrated, photolithography controls are implemented by control threads. Each control thread acts like a separate controller and is differentiated by various process conditions. For photolithography control, the control threads are separated by a combination of different conditions. These conditions may include, for example, the semiconductor photolithography processing tool 2010 currently processing the wafer lot, the semiconductor product, the semiconductor manufacturing operation, and one or more of the semiconductor processing tools (not shown) that previously processed the semiconductor wafer lot.

Control threads are separated because different process conditions affect the photolithography overlay error (POE) differently. By isolating each of the process conditions into its own corresponding control thread, the POE can become a more accurate portrayal of the conditions in which a subsequent semiconductor wafer lot in the control thread will be processed. Since the error measurement is more relevant, changes to the photolithography control input signals based upon the error will be more appropriate.

The control thread for the photolithography control scheme depends upon the current photolithography processing tool, current operation, the product code for the current lot, and the identification number at a previous processing step. The first three parameters are generally found in the context information that is passed to the script from the photolithography processing tool 2010. The fourth parameter is generally stored when the lot is previously processed.

Once all four parameters are defined, they are combined to form the control thread name; PHOT02_OPER01_PROD01_PHOT01 is an example of a control thread name. The control thread name is also stored in correspondence to the wafer lot number in the data store 2060.

Once the lot is associated with a control thread name, the initial settings for that control thread are generally retrieved from the data store 2060. There are at least two possibilities when the call is made for the information. One possibility is that there are no settings stored under the current control thread name. This can happen when the control thread is new, or if the information was lost or deleted. In these cases, the script initializes the control thread assuming that there is no error associated with it and uses the target values of the photolithography errors as the photolithography control input settings. It is preferred that the controllers use the default machine settings as the initial settings. By assuming some settings, the photolithography errors can be related back to the control settings in order to facilitate feedback control.

Another possibility is that the initial settings are stored under the control thread name. In this case, one or more wafer lots have been processed under the same control thread name as the current wafer lot, and have also been measured for photolithography error using the review station 2017. When this information exists, the photolithography control input signal settings are retrieved from the data store 2060. These settings are then downloaded to the photolithography processing tool 2010.

The wafers 2005 are processed through the photolithography processing tool 2010. This includes, in the embodiment illustrated, photoresist deposition and/or patterning, as schematically illustrated in FIGS. 3–5 discussed above. The wafers 2005 are measured on the review station 2017 after their photolithography processing on the photolithography processing tool 2010. The review station 2017 examines the wafers 2005 after they are processed for a number of errors. The data generated by the instruments of the review station 2017 is passed to the machine interface 2130 via sensor interface 2122 and the line 2020. The review station script begins with a number of APC commands for the collection of data. The review station script then locks itself in place and activates a data available script. This script facilitates the actual transfer of the data from the review station 2017 to the APC framework. Once the transfer is completed, the script exits and unlocks the review station script. The interaction with the review station 2017 is then generally complete.

As will be appreciated by those skilled in the art having the benefit of this disclosure, the data generated by the review station 2017 should be preprocessed for use. Review stations, such as KLA review stations, provide the control algorithms for measuring the control error. Each of the error measurements, in this particular embodiment, corresponds to one of the photolithography control input signals on the line 2020 in a direct manner. Before the error can be utilized to correct the photolithography control input signal, a certain amount of preprocessing is generally completed.

For example, preprocessing may include outlier rejection. Outlier rejection is a gross error check ensuring that the received data is reasonable in light of the historical performance of the process. This procedure involves comparing each of the photolithography errors to its corresponding predetermined boundary parameter. In one embodiment, even if one of the predetermined boundaries is exceeded, the error data from the entire semiconductor wafer lot is generally rejected.

To determine the limits of the outlier rejection, thousands of actual semiconductor manufacturing fabrication ("fab") data points are collected. The standard deviation for each error parameter in this collection of data is then calculated. In one embodiment, for outlier rejection, nine times the standard deviation (both positive and negative) is generally chosen as the predetermined boundary. This was done primarily to ensure that only the points that are significantly outside the normal operating conditions of the process are rejected.

Preprocessing may also smooth the data, which is also known as filtering. Filtering is important because the error measurements are subject to a certain amount of randomness, such that the error significantly deviates in value. Filtering the review station data results in a more accurate assessment of the error in the photolithography control input signal settings. In one embodiment, the photolithography control scheme utilizes a filtering procedure known as an Exponentially-Weighted Moving Average ("EWMA") filter, although other filtering procedures can be utilized in this context.

One embodiment for the EWMA filter is represented by Equation (1):

$$AVG_N = W*M_C + (1-W)*AVG_P \qquad (1)$$

where $AVG_N$=the new EWMA average;

W=a weight for the new average ($AVG_N$);

$M_C$=the current measurement; and $AVG_P$=the previous EWMA average.

The weight is an adjustable parameter that can be used to control the amount of filtering and is generally between zero and one. The weight represents the confidence in the accuracy of the current data point. If the measurement is considered accurate, the weight should be close to one. If there were a significant amount of fluctuations in the process, then a number closer to zero would be appropriate.

In one embodiment, there are at least two techniques for utilizing the EWMA filtering process. The first technique uses the previous average, the weight, and the current measurement as described above. Among the advantages of utilizing the first implementation are ease of use and minimal data storage. One of the disadvantages of utilizing the first implementation is that this method generally does not retain much process information. Furthermore, the previous average calculated in this manner would be made up of every data point that preceded it, which may be undesirable. The second technique retains only some of the data and calculates the average from the raw data each time.

The manufacturing environment in the semiconductor manufacturing fab presents some unique challenges. The order that the semiconductor wafer lots are processed through a photolithography processing tool may not correspond to the order in which they are read on the review station. This could lead to the data points being added to the EWMA average out of sequence. Semiconductor wafer lots may be analyzed more than once to verify the error measurements. With no data retention, both readings would contribute to the EWMA average, which may be an undesirable characteristic. Furthermore, some of the control threads may have low volume, which may cause the previous average to be outdated such that it may not be able to accurately represent the error in the photolithography control input signal settings.

The photolithography processing tool controller 2022, in this particular embodiment, uses limited storage of data to calculate the EWMA filtered error, i.e., the first technique. Wafer lot data, including the lot number, the time the lot was processed, and the multiple error estimates, are stored in the data store 2060 under the control thread name. When a new set of data is collected, the stack of data is retrieved from data store 2060 and analyzed. The lot number of the current lot being processed is compared to those in the stack. If the lot number matches any of the data present there, the error measurements are replaced. Otherwise, the data point is added to the current stack in chronological order, according to the time periods when the lots were processed. In one embodiment, any data point within the stack that is over 218 hours old is removed. Once the aforementioned steps are complete, the new filter average is calculated and stored to data store 2060.

Thus, the data is collected and preprocessed, and then processed to generate an estimate of the current errors in the photolithography control input signal settings. First, the data is passed to a compiled Matlab® plug-in that performs the outlier rejection criteria described above. The inputs to a plug-in interface are the multiple error measurements and an array containing boundary values. The return from the plug-in interface is a single toggle variable. A nonzero return denotes that it has failed the rejection criteria, otherwise the variable returns the default value of zero and the script continues to process.

After the outlier rejection is completed, the data is passed to the EWMA filtering procedure. The controller data for the control thread name associated with the lot is retrieved, and all of the relevant operation upon the stack of lot data is carried out. This includes replacing redundant data or removing older data. Once the data stack is adequately prepared, it is parsed into ascending time-ordered arrays that correspond to the error values. These arrays are fed into the EWMA plug-in along with an array of the parameter required for its execution. In one embodiment, the return from the plug-in is comprised of the six filtered error values.

Returning to FIG. 22, data preprocessing includes measuring a characteristic parameter in a photolithography operation, such as workpiece 2005 POE, arising from photolithography processing control of the photolithography processing tool 2010, as set forth in box 2220. Known, potential characteristic parameters may be identified by characteristic data patterns or may be identified as known consequences of modifications to critical dimension control. The example of how changes in POE affect yield given above falls into this latter category.

The next step in the control process is to calculate the new settings for the photolithography processing tool controller 2022 of the photolithography processing tool 2010. The previous settings for the control thread corresponding to the current wafer lot are retrieved from the data store 2060. This data is paired along with the current set of photolithography errors. The new settings are calculated by calling a compiled Matlab® plug-in. This application incorporates a number of inputs, performs calculations in a separate execution component, and returns a number of outputs to the main script. Generally, the inputs of the Matlab® plug-in are the photolithography control input signal settings, the review station errors, an array of parameters that are necessary for the control algorithm, and a currently unused flag error. The outputs of the Matlab® plug-in are the new controller settings, calculated in the plug-in according to the controller algorithm described above.

A photolithography process engineer or a control engineer, who generally determines the actual form and extent of the control action, can set the parameters. They include the threshold values, maximum step sizes, controller weights, and target values. Once the new parameter settings are calculated, the script stores the setting in the data store 2060 such that the photolithography processing tool 2010 can retrieve them for the next wafer lot to be processed. The principles taught by the present invention can be implemented into other types of manufacturing frameworks.

Returning again to FIG. 22, the calculation of new settings includes, as set forth in box 2230, modeling the identified characteristic parameter. This modeling may be performed by the Matlab® plug-in. In this particular embodiment, only known, potential characteristic parameters are modeled and the models are stored in a database 2035 accessed by a machine interface 2130. The database 2035 may reside on the workstation 2030, as shown, or some other part of the APC framework. For instance, the models might be stored in the data store 2060 managed by the APC system manager 2140 in alternative embodiments. The model will generally be a mathematical model, i.e., an equation describing how the change(s) in photolithography recipe control(s) affects the photolithography performance and the semiconductor device yield, and the like. As discussed above, the photolithography overlay error test (POET) measurements, represented generally by a vector $\epsilon$, may be put into a semiconductor device yield model, represented generally by a function $Y(\epsilon)$, which maps the POET measurements $\epsilon$ into a measure of the semiconductor device yield, represented generally by a scalar y, characteristic of the processing performed in at least one of the processing steps j 105, where j may have any value from j=1 to j=N−1, so that $Y(\epsilon)$=y. The semiconductor device yield model may be optimized by finding the maximum of $Y(\epsilon)$=y, with respect to variations in the POET measurements $\epsilon$.

For example, if $Y(\epsilon)=y=Y(|\epsilon|)=|\epsilon|^n \exp(-a|\epsilon|)$, then the condition $\partial Y(|\epsilon|)/\partial |\epsilon|=0=n|\epsilon|^{n-1}\exp(-a|\epsilon|)-a|\epsilon|^n \exp(-a|\epsilon|)=(n-a|\epsilon|)|\epsilon|^{n-1}\exp(-a|\epsilon|)$ defines the extrema of $Y(\epsilon)=y=Y(|\epsilon|)=|\epsilon|^n \exp(-a|\epsilon|)$. The further condition $\partial^2 Y(|\epsilon|)/\partial |\epsilon|^2=-a|\epsilon|^{n-1}\exp(-a|\epsilon|)<0$ at $n=a|\epsilon|$ confirms that $n=a|\epsilon|$ maximizes $Y(\epsilon)=y=Y(|\epsilon|)=|\epsilon|^n \exp(-a|\epsilon|)$.

The particular model used will be implementation specific, depending upon the particular photolithography processing tool 2010 and the particular characteristic parameter being modeled. Whether the relationship in the model is linear or non-linear will be dependent on the particular parameters involved.

The new settings are then transmitted to and applied by the photolithography processing tool controller 2022. Thus, returning now to FIG. 22, once the identified characteristic parameter is modeled, the model is applied to modify at least one photolithography recipe control input parameter, as set forth in box 2240. In this particular embodiment, the machine interface 2130 retrieves the model from the database 2035, plugs in the respective value(s), and determines the necessary change(s) in the photolithography recipe control input parameter(s). The change is then communicated by the machine interface 2130 to the equipment interface 2110 over the line 2020. The equipment interface 2110 then implements the change.

The present embodiment furthermore provides that the models be updated. This includes, as set forth in boxes 2250–2260 of FIG. 22, monitoring at least one effect of modifying the photolithography recipe control input parameters (box 2250) and updating the applied model (box 2260) based on the effect(s) monitored. For instance, various aspects of the operation of the photolithography processing tool 2010 will change as the photolithography processing tool 2010 ages. By monitoring the effect of the photolithography recipe change(s) implemented as a result of the characteristic parameter (e.g., workpiece 2005 POE) measurement, the necessary value could be updated to yield superior performance.

As noted above, this particular embodiment implements an APC system. Thus, changes are implemented "between" lots. The actions set forth in the boxes 2220–2260 are implemented after the current lot is processed and before the second lot is processed, as set forth in box 2270 of FIG. 22. However, the invention is not so limited. Furthermore, as noted above, a lot may constitute any practicable number of wafers from one to several thousand (or practically any finite number). What constitutes a "lot" is implementation specific, and so the point of the fabrication process in which the updates occur will vary from implementation to implementation.

Any of the above-disclosed embodiments of a method of manufacturing according to the present invention enables fast analysis of process and/or tool problems throughout the wafer processing, and evaluation of final semiconductor device yields on a die-by-die basis, as well as enabling the making of supervisory processing adjustments, either manually and/or automatically, to improve and/or better control the yield. Additionally, any of the above-disclosed embodiments of a method of manufacturing according to the present invention enables semiconductor device fabrication with increased device accuracy and precision, increased efficiency and increased device yield, enabling a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of manufacturing, the method comprising:
   processing a workpiece in a plurality of different types of processing steps;
   measuring characteristics of the different types of processing performed on the workpiece in at least two of the plurality of different types of processing steps; and
   displaying the characteristics measured by overlaying the characteristics measured at each of the at least two of the plurality of different types of processing steps to display different types of processing errors associated with a final resulting workpiece.

2. The method of claim 1, the method further comprising:
   forming a plurality of output signals corresponding to the characteristics measured by using the characteristics measured as input to a semiconductor device yield model; and
   predicting a semiconductor device yield value based on the plurality of output signals.

3. The method of claim 2, the method further comprising:
   detecting faulty processing performed in at least one of the plurality of processing steps based on at least one of the plurality of output signals; and
   correcting the faulty processing performed in the at least one of the plurality of processing steps.

4. The method of claim 1, wherein displaying the characteristics measured by overlaying the characteristics measured at each of the at least two of the plurality of processing steps to display the final resulting workpiece includes using a graphic user interface (GUI) to display the characteristics measured.

5. The method of claim 2, wherein displaying the characteristics measured by overlaying the characteristics measured at each of the at least two of the plurality of processing steps to display the final resulting workpiece includes using a graphic user interface (GUI) to display the characteristics measured.

6. The method of claim 3, wherein displaying the characteristics measured by overlaying the characteristics measured at each of the at least two of the plurality of processing steps to display the final resulting workpiece includes using a graphic user interface (GUI) to display the characteristics measured.

7. The method of claim 1, wherein measuring characteristics of the processing performed on the workpiece includes measuring photolithography hotspots.

8. The method of claim 1, wherein measuring characteristics of the processing performed on the workpiece includes measuring sites having photolithography overlay errors outside a tolerance range.

9. The method of claim 1, wherein measuring characteristics of the processing performed on the workpiece includes measuring sites having etch uniformity issues.

10. The method of claim 1, wherein measuring characteristics of the processing performed on the workpiece includes measuring sites having deposition uniformity issues.

11. The method of claim 1, wherein measuring characteristics of the processing performed on the workpiece includes measuring sites having polishing uniformity issues.

12. The method of claim 1, wherein measuring characteristics of the processing performed on the workpiece includes measuring sites having bridging issues.

13. A computer-readable, program storage device encoded with instructions that, when executed by a computer, perform a method for processing a workpiece, the method comprising:
    processing a workpiece in a plurality of different types of processing steps;
    measuring characteristics of the different types of processing performed on the workpiece in at least two of the plurality of different types of processing steps; and
    displaying the characteristics measured by overlaying the characteristics measured at each of the at least two of the plurality of different types of processing steps to display different types of processing errors associated with a final resulting workpiece.

14. The computer-readable, program storage device of claim 13, the method further comprising:
    forming a plurality of output signals corresponding to the characteristics measured by using the characteristics measured as input to a semiconductor device yield model; and
    predicting a semiconductor device yield value based on the plurality of output signals.

15. The computer-readable, program storage device of claim 14, the method further comprising:
    detecting faulty processing performed in at least one of the plurality of processing steps based on at least one of the plurality of output signals; and
    correcting the faulty processing performed in the at least one of the plurality of processing steps.

16. The computer-readable, program storage device of claim 13, wherein displaying the characteristics measured by overlaying the characteristics measured at each of the at least two of the plurality of processing steps to display the final resulting workpiece includes using a graphic user interface (GUI) to display the characteristics measured.

17. The computer-readable, program storage device of claim 14, wherein displaying the characteristics measured by overlaying the characteristics measured at each of the at least two of the plurality of processing steps to display the final resulting workpiece includes using a graphic user interface (GUI) to display the characteristics measured.

18. The computer-readable, program storage device of claim 15, wherein displaying the characteristics measured by overlaying the characteristics measured at each of the at least two of the plurality of processing steps to display the final resulting workpiece includes using a graphic user interface (GUI) to display the characteristics measured.

19. The computer-readable, program storage device of claim 13, wherein measuring characteristics of the processing performed on the workpiece includes measuring photolithography hotspots.

20. The computer-readable, program storage device of claim 13, wherein measuring characteristics of the processing performed on the workpiece includes measuring sites having photolithography overlay errors outside a tolerance range.

21. The computer-readable, program storage device of claim 13, wherein measuring characteristics of the processing performed on the workpiece includes measuring sites having etch uniformity issues.

22. The computer-readable, program storage device of claim 13, wherein measuring characteristics of the processing performed on the workpiece includes measuring sites having deposition uniformity issues.

23. The computer-readable, program storage device of claim 13, wherein measuring characteristics of the processing performed on the workpiece includes measuring sites having polishing uniformity issues.

24. The computer-readable, program storage device of claim 13, wherein measuring characteristics of the processing performed on the workpiece includes measuring sites having bridging issues.

25. A computer programmed to perform a method of manufacturing, the method comprising:
   processing a workpiece in a plurality of different types of processing steps;
   measuring characteristics of the different types of processing performed on the workpiece in at least two of the plurality of different types of processing steps; and
   displaying the characteristics measured by overlaying the characteristics measured at each of the at least two of the plurality of different types of processing steps to display different types of processing errors associated with a final resulting workpiece.

26. The computer of claim 25, the method further comprising:
   forming a plurality of output signals corresponding to the characteristics measured by using the characteristics measured as input to a semiconductor device yield model; and
   predicting a semiconductor device yield value based on the plurality of output signals.

27. The computer of claim 26, the method further comprising:
   detecting faulty processing performed in at least one of the plurality of processing steps based on at least one of the plurality of output signals; and
   correcting the faulty processing performed in the at least one of the plurality of processing steps.

28. The computer of claim 25, wherein displaying the characteristics measured by overlaying the characteristics measured at each of the at least two of the plurality of processing steps to display the final resulting workpiece includes using a graphic user interface (GUI) to display the characteristics measured.

29. The computer of claim 26, wherein displaying the characteristics measured by overlaying the characteristics measured at each of the at least two of the plurality of processing steps to display the final resulting workpiece includes using a graphic user interface (GUI) to display the characteristics measured.

30. The computer of claim 27, wherein displaying the characteristics measured by overlaying the characteristics measured at each of the at least two of the plurality of processing steps to display the final resulting workpiece includes using a graphic user interface (GUI) to display the characteristics measured.

31. The computer of claim 25, wherein measuring characteristics of the processing performed on the workpiece includes measuring photolithography hotspots.

32. The computer of claim 25, wherein measuring characteristics of the processing performed on the workpiece includes measuring sites having photolithography overlay errors outside a tolerance range.

33. The computer of claim 25, wherein measuring characteristics of the processing performed on the workpiece includes measuring sites having etch uniformity issues.

34. The computer of claim 25, wherein measuring characteristics of the processing performed on the workpiece includes measuring sites having deposition uniformity issues.

35. The computer of claim 25, wherein measuring characteristics of the processing performed on the workpiece includes measuring sites having polishing uniformity issues.

36. The computer of claim 25, wherein measuring characteristics of the processing performed on the workpiece includes measuring sites having bridging issues.

* * * * *